US008501534B2

(12) United States Patent
Oppermann et al.

(10) Patent No.: US 8,501,534 B2
(45) Date of Patent: Aug. 6, 2013

(54) METHOD FOR HOUSING AN ELECTRONIC COMPONENT IN A DEVICE PACKAGE AND AN ELECTRONIC COMPONENT HOUSED IN THE DEVICE PACKAGE

(75) Inventors: Klaus-Guenter Oppermann, Holzkirchen (DE); Martin Franosch, Munich (DE); Bernhard Gebauer, Tuntenhausen (DE)

(73) Assignee: Infineon Technologies AG, Neubiberg (DE)

( * ) Notice: Subject to any disclaimer, the term of this patent is extended or adjusted under 35 U.S.C. 154(b) by 1161 days.

(21) Appl. No.: 12/174,359

(22) Filed: Jul. 16, 2008

(65) Prior Publication Data

US 2010/0013032 A1    Jan. 21, 2010

(51) Int. Cl.
*H01L 21/00* (2006.01)

(52) U.S. Cl.
USPC ..... 438/106; 438/108; 438/455; 257/E21.511

(58) Field of Classification Search
USPC ............... 438/51, 106–108, 110, 112, 113, 438/121, 455, 456, 460; 257/E21.511
See application file for complete search history.

(56) References Cited

U.S. PATENT DOCUMENTS

| 7,234,237 | B2 | 6/2007 | Franosch et al. |
| 7,288,435 | B2 * | 10/2007 | Aigner et al. ................ 438/118 |
| 7,300,823 | B2 | 11/2007 | Franosch et al. |

FOREIGN PATENT DOCUMENTS

DE    10 2004 004 476 B3    7/2005

OTHER PUBLICATIONS

Wang, K., et al., "High rejection Rx filters for GSM handsets with wafer level packaging," 2002 IEEE Ultrasonics Symposium, Oct. 8-11, 2002, pp. 925-929,vol. 1, IEEE.
Kando, H., et al., "RF Filter using Boundary Acoustic Wave," 2006 IEEE Ultrasonics Symposium , Oct. 2-6, 2006, pp. 188-191, IEEE.

* cited by examiner

*Primary Examiner* — Jack Chen
(74) *Attorney, Agent, or Firm* — Slater & Matsil, L.L.P.

(57) ABSTRACT

A method for housing an electronic component in a device package includes providing a first substrate, wherein the electronic component is arranged in a component area on a first main surface of the first substrate, and wherein first contact pads are arranged outside of the component area, forming an open top frame structure around the component area on the first main surface of the first substrate, providing a second substrate having second contact pads, arranged symmetrically to the first contact pads and electrically and mechanically connecting the first main surface of the first substrate with the first main surface of the second substrate, so that the frame structure and the second substrate from a cavity or recess around the electronic component on the first substrate.

17 Claims, 16 Drawing Sheets

US 8,501,534 B2

METHOD FOR HOUSING AN ELECTRONIC COMPONENT IN A DEVICE PACKAGE AND AN ELECTRONIC COMPONENT HOUSED IN THE DEVICE PACKAGE

BACKGROUND

The invention relates to a method for housing an electronic component in a device package and an electronic component housed in the device package. It especially relates to electronic components such as bulk acoustic wave (BAW) filters or surface acoustic wave (SAW) filters, for example, that should not be contacted by molding mass on their top sides in a subsequent molding process for not degrading their acoustic performance. For these electronic components it is difficult to create conditions, under which a distance to the laminate/package bottom is complied with without the device top side being contacted by molding mass or laminate respectively in the subsequent molding process.

SUMMARY OF THE INVENTION

Embodiments provide a method for housing an electronic component in a device package, comprising the steps providing a first substrate, wherein the electronic component is arranged in a component area on a first main surface of the first substrate, and wherein first contact pads, electrically coupled to the electronic component, are arranged on the first main surface and outside of the component area, forming an open top frame structure around the component area on the first main surface of the first substrate, providing a second substrate having second contact pads, wherein the second contact pads are arranged on a first main surface of the second substrate and symmetrically to the first contact pads on the first substrate and electrically and mechanically connecting the first main surface of the first substrate with the first main surface of the second substrate, so that the frame structure and the second substrate from a cavity or recess around the electronic component on the first substrate.

Embodiments form an open top frame structure around the component area which can be closed by flip-chip mounting the device. Using the flip-chip mounting technique allows utilizing an open top frame structure which forms a cavity or recess around the electronic component by reverse mounting of the laminate or package bottom (second substrate respectively) on the chip (first substrate respectively). The cavity or recess protects the electronic component against penetration of molding mass which may result in a degradation of acoustic performance and/or destruction of the chip. By using the flip-chip mounting technique the frame structure requires no cover or top, respectively resulting in a reduced frame height and therefore reduced heights of the whole device package.

DETAILED DESCRIPTION OF ILLUSTRATIVE EMBODIMENTS

With reference to the accompanying FIG. 1 to 27, embodiments of a method for housing an electronic component in a device package and an electronic component housed in a device package will be hereinafter described.

In the accompanying figures same reference numbers are used for features or elements having the same or an equivalent functionality.

Figure 1:
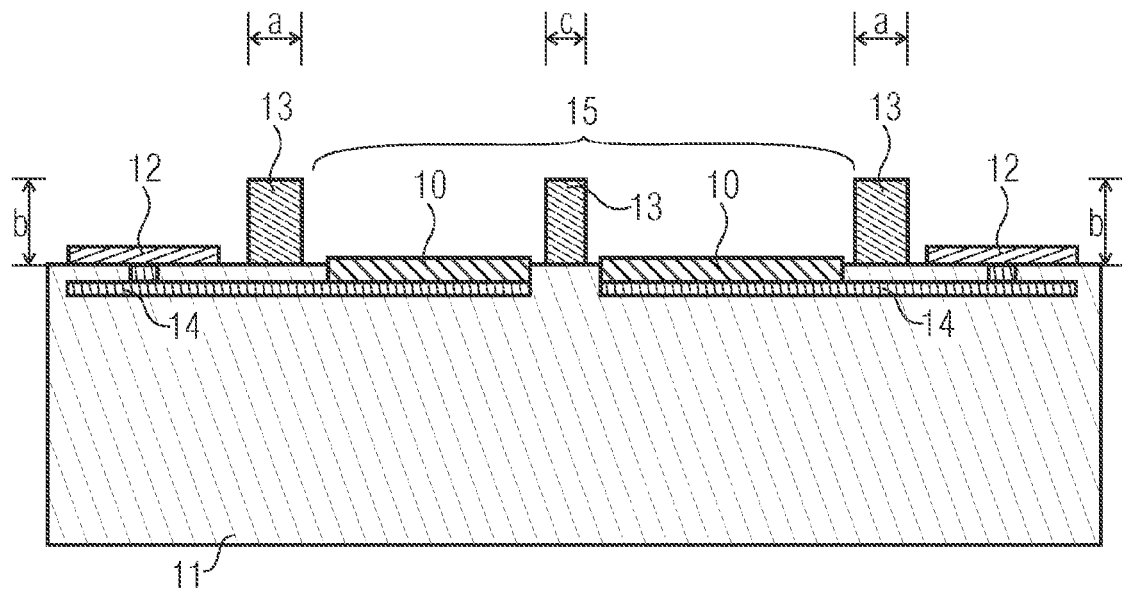
FIG. 1 shows a cross-section A-B of a first substrate with a first open top frame structure.
Figure 2:
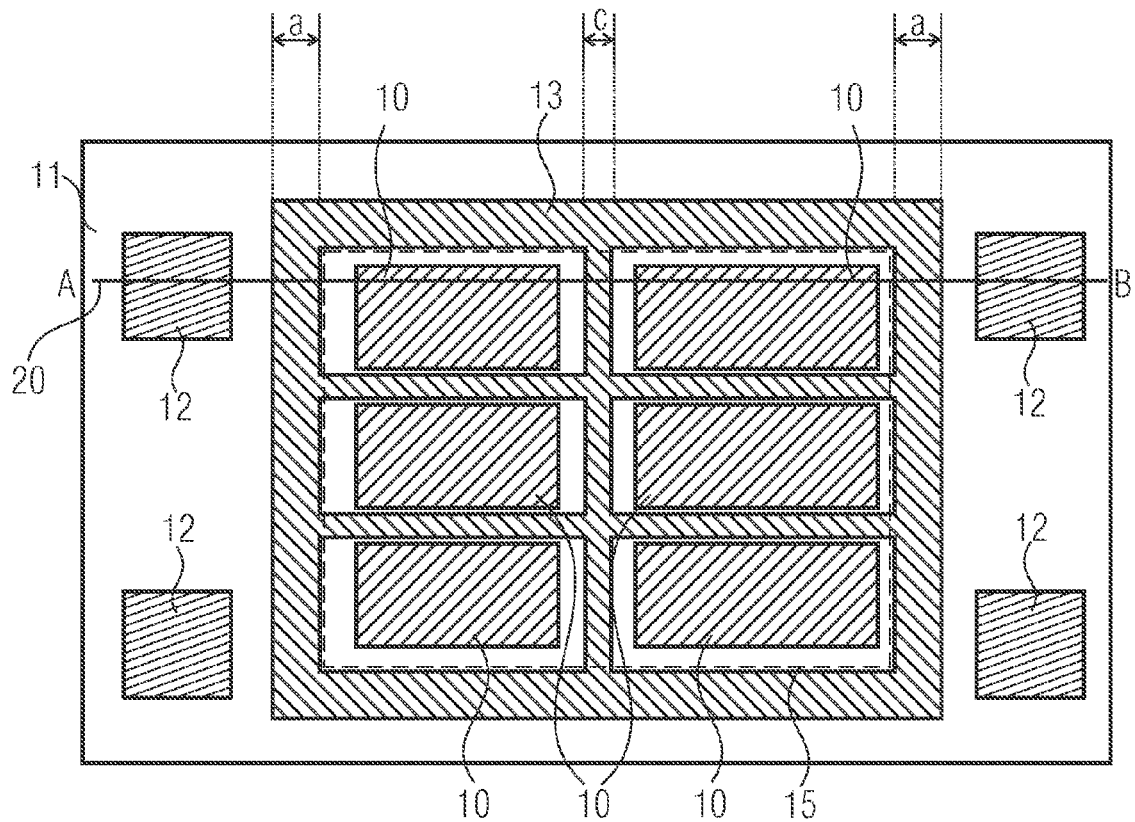
FIG. 2 shows a top view of the first substrate as shown in the cross-section A-B in FIG. 1 and the cut axis A-B.

FIG. 1 shows a cross-section A-B of a first substrate 11 with a first open top frame structure 13 according to an embodiment. A first substrate 11, for example, a substrate wafer may have two resonator stacks 10 or electronic components, respectively arranged in a component area 15 on a first main surface of the first substrate 11. The electronic components 10 may be connected by a connecting layer 14. The connecting layer 14 may also provide an electrical connection between a contact pad 12 and an electronic component 10. Two contact pads 12, electrically coupled to the electronic component 10 are arranged on the main surface and outside of the component area 15. On the first main surface of the first substrate 11, a first open-top frame structure 13 is formed around the component area 15. The component area 15 is the area on the main surface of the first substrate 11 where the resonator stacks 10 or the electronic components, respectively are arranged. In FIG. 1, two resonator stacks 10 can be seen in the middle of the first substrate 11 at the main surface of the first substrate 11. FIG. 2 depicts the top view corresponding to the cross-section as depicted in FIG. 1. It can be seen from FIG. 2 that the first main surface of the first substrate 11 comprises six resonator stacks 10 and four contact pads 12. These numbers are exemplary. The first substrate 11 may also comprise any other number of electronic components 10 and contact pads 12 for electrically contacting the electronic components 10.

The first open-top frame structure 13 forms a frame around the two resonator stacks 10 with a thicker outer frame portion and a thinner inner frame portion between the two resonator stacks 10, wherein the outer frame portion may have a width "a" and a height "b" and the inner frame portion may have a width "c", which is around 20 to 70 percent of "a", and a corresponding height "b". The first open-top frame structure 13, for example, may be made of a photo-patternable epoxy resist, e.g., SU-8. The photo resist may be span on, exposed and developed, for example. The first open top frame structure 13 is adapted to frame the electronic component 10 without extending to the first contact pads 12. In this embodiment the first contact pads 12 are arranged at the outer portions of the first substrate 11 and at the first main surface of the first substrate 11. The first contact pads 12 are adapted to electrically couple the electronic component 10 and to connect it to a terminal. The first substrate 11 may be made of silicon, the contact pads 12 may be made of metal.

According to this embodiment, a method for housing an electronic component 10 in a device package may comprise the steps providing a first substrate 11, wherein the electronic component 10 is arranged in a component area 15 on a first main surface of the first substrate 11, and wherein first contact pads 12, electrically coupled to the electronic component 10, are arranged on the first main surface and outside of the component area 15 and forming an open top frame structure 13 around the component area 15 on the first main surface of the first substrate 11.

FIG. 2 shows a top view of the first substrate 11 shown in the cross-section A-B in FIG. 1 and the cut axis A-B. By looking at the top of the first substrate 11, it can be seen that in this embodiment, the first substrate 11 comprises exemplary six (or any other number of) electronic components or resonator stacks 10, respectively. By cutting the first substrate 11 towards the cutting plane A-B 20, two of the six electronic components 10 are visible in FIG. 1. The structure of the first open top frame structure 13 with a broad outer frame portion of width "a" surrounding the six electronic components 10 and an optional thinner inner frame portion of width "c" separating the six electronic components 10 is depicted in FIG. 2.

The outer and inner frame portions do not necessarily have to be symmetrical. It may be useful to vary the thickness or width of the inner or outer frame portions depending on requirements concerning adhesive strength of the frame portion, stability of the frame structure, etc. The inner and outer frame portions may vary in width. It may be necessary to leave specific circuit portions uncovered. Depending on these requirements the form and thickness of the open-top frame structure may vary. The first open top frame structure 13 may have a height of 1 μm to 100 μm, for example. The aspect ratio corresponding to the relation between the width "a" and the height "b" of the open-top frame structure depends on the required stability of the frame structure. The aspect ratio (a:b) may range from 1:0.5 to 1:4. Some embodiments have a closer aspect ratio ranging from 1:1.5 to 1:3, other embodiments have an aspect ratio of about 1:2. The inner frame portions may have a different thickness "c" than the outer frame portions "a". The available place on the component area may be limited due to a high integration of electric components on the first substrate. The inner frame portions may have a width "c" of 20-70 percent of the width "a" of the outer frame portions, for example. Other embodiments may provide inner frame portions having a width "c" of 40-60 percent or about 50 percent of the outer frame portions width "a". The height "b" of the inner frame portions may correspond to the height "b" of the outer frame portions to provide an equal height of both frame portions.

The component area 15 comprises the areas of the six electronic components 10 including the area between the electronic components 10 and an outer portion around the electronic components 10. The first substrate 11 may be a substrate wafer comprising six different electronic components 10 or may be a single chip comprising the six electronic components 10. The first substrate 11 according to the embodiment comprises four contact pads 12 at its surface, wherein the two upper contact pads 12 are depicted in the sectional view in FIG. 1. The number of contact pads 12 is not limited to four, also any other adequate number of contact pads 12 can be used for contacting the electronic components 10.

Figure 3:
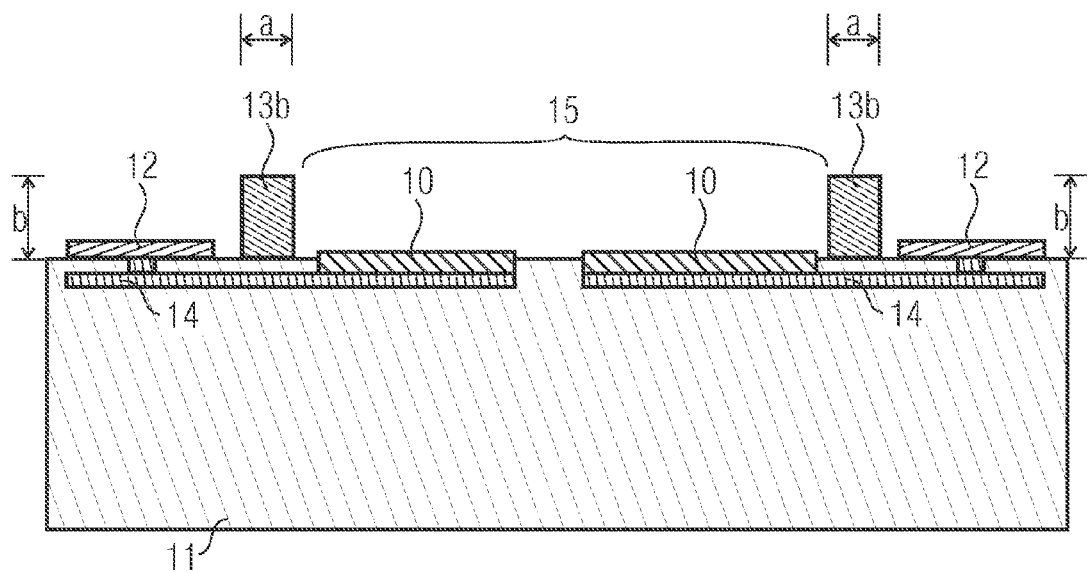
FIG. 3 shows a cross-section C-D of a first substrate with a second open top frame structure.

FIG. 3 shows a cross-section C-D of a first substrate 11 with a second open top frame structure 13b according to another embodiment. The second open-top frame structure 13b differs from the first open-top frame structure 13 by a missing inner frame structure for separation of the electronic components 10 from each other. The second open-top frame structure 13b comprises an outer frame structure for surrounding the component area 15 without separating the left shown electronic component 10 depicted in FIG. 3 from the right shown electronic component 10. The first substrate 11 further comprises a connecting layer 14 and first contact pads 12 corresponding to the embodiment depicted in FIG. 1. The second open-top frame structure 13b may also be produced by a photolithographically patternable material, e.g., a photo epoxy resist. The second open-top frame structure 13b is used for sealing the electronic component 10 arranged on the component area 15 against penetration of a molding mass in a following molding processing step. For an accurate sealing minute gaps remaining between the second open-top frame structure 13b and the first substrate 11 may have a gap width of less than 1 µm in this embodiment.

Figure 4:
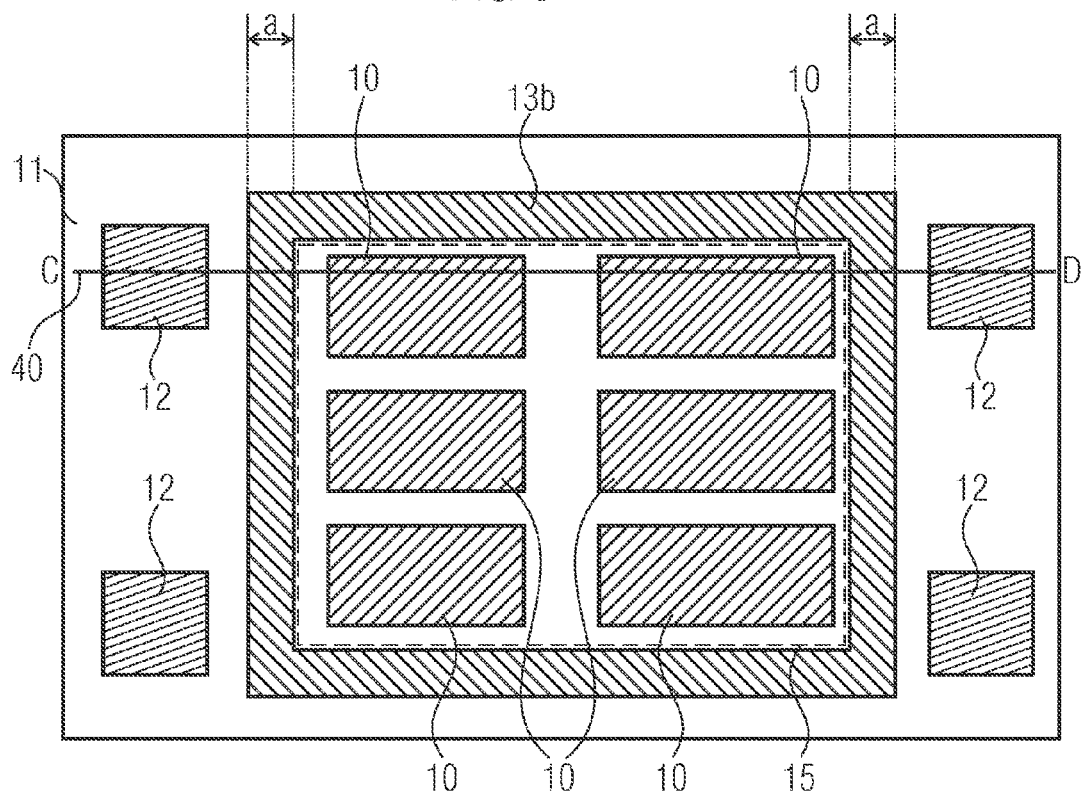
FIG. 4 shows a top view of the first substrate as shown in the cross-section C-D in FIG. 3 and the cut axis C-D.

FIG. 4 shows a top view of the first substrate 11 shown in the cross-section C-D in FIG. 3 and the cut axis C-D. By this top view the first substrate 11 comprising an exemplary number of six electronic components 10, an exemplary number of four first contact pads 12 and a second open-top frame structure 13b can be seen. FIG. 4 differs from FIG. 2 in the structure of the second open top frame structure 13b which has no inner frame structure in contrast to FIG. 2.

Figure 5:
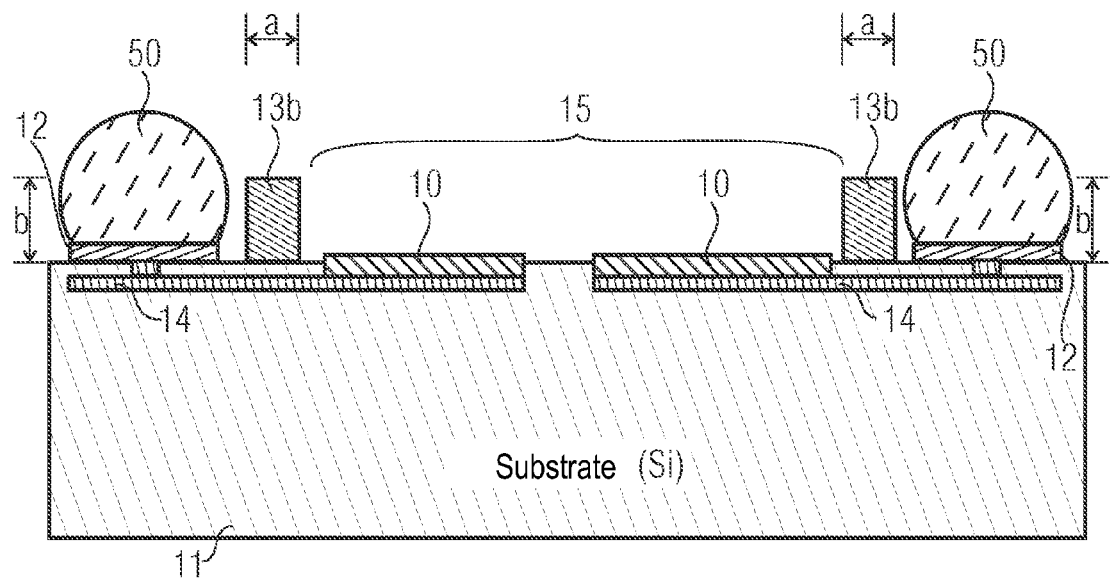
FIG. 5 shows a cross-section E-F of the first substrate as shown in FIG. 3 with contact balls on first contact pads.

FIG. 5 shows a cross-section E-F of the first substrate 11 shown in FIG. 3 with additional contact balls 50 on the first contact pads 12 according to an embodiment. According to FIG. 5, the first substrate 11 comprises a connecting layer 14, two electronic components 10 being visible in the cross-section E-F, two first contact pads 12 and a second open-top frame structure 13b around the component area 15. By means of template printing, solder repositories and subsequently, during a first reflowing in the oven, the contact balls 50 are fabricated on the first contact pads 12. Solder may be applied to the first contact pads 12, for example, by means of a liquid fill process, by template printing or by ball placement. By reflowing the solder the contact balls 50 on the contact pads 12 may be formed.

Figure 6:
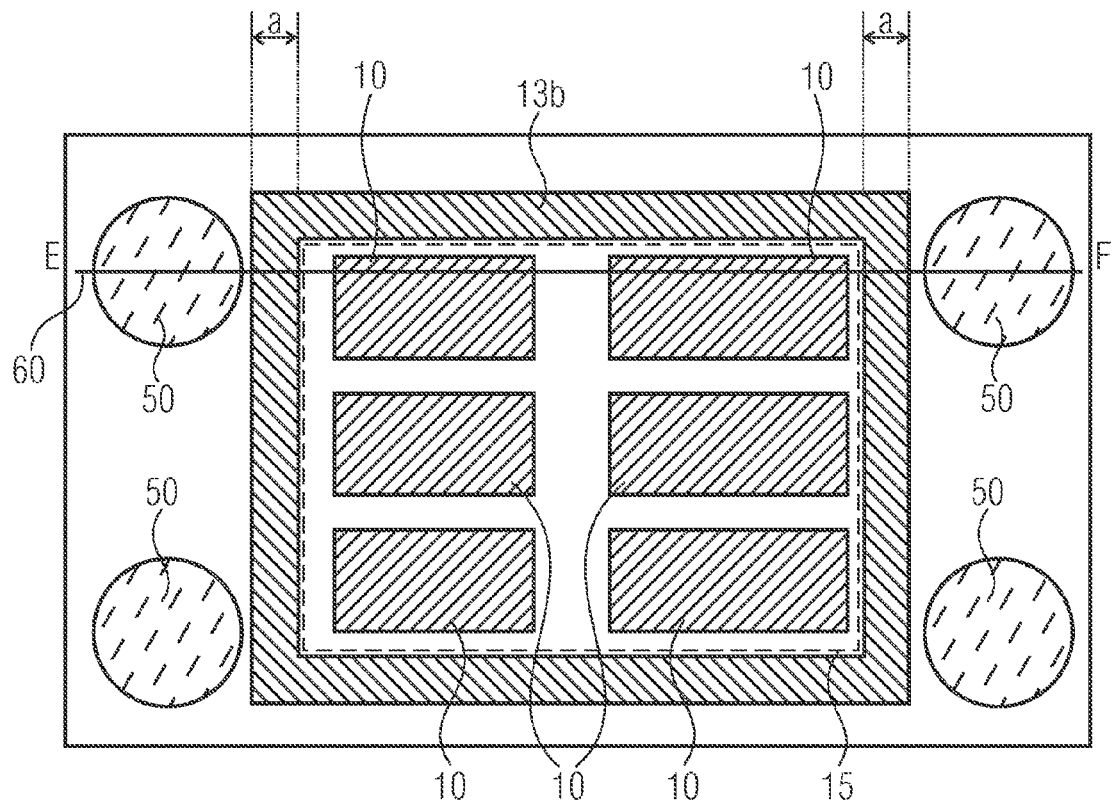
FIG. 6 shows a top view of the first substrate as shown in the cross-section E-F in FIG. 5 with the cut axis E-F.

FIG. 6 shows a top view of the first substrate 11 as shown in the cross-section E-F in FIG. 5 and the cut axis E-F 60. The top view depicts the first substrate 11 comprising exemplary six electronic components or resonator stacks 10, respectively on the component area 15 surrounded by the second open-top frame structure 13b corresponding to the representation in FIG. 4. The top view further depicts exemplary four contact balls 50 positioned on the first contact pads 12. The number of contact balls 50 is not limited to four, it may be any number. Also the number of electronic components 10 may be any number.

Figure 7:
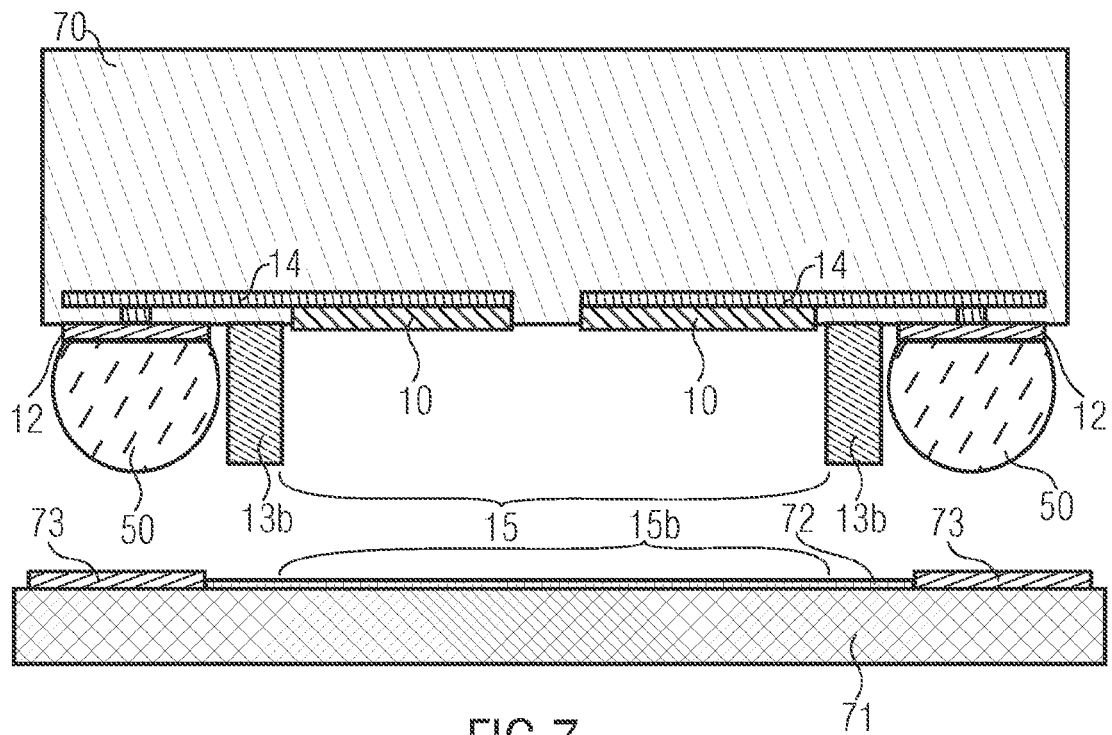
FIG. 7 shows a cross-section of the first substrate as shown in FIG. 5, diced into a separate chip and turned in a position for flip-chip mounting and a cross-section of a second substrate below the first substrate.

FIG. 7 shows a cross-section of the first substrate 11 shown in FIG. 5, diced into a separate chip 70 and turned in a position for flip-chip mounting and shows a cross-section of a second substrate 71 below the first substrate according to an embodiment.

In this embodiment the first substrate 11 may be a chip, for example, a bulk acoustic wave (BAW) chip produced by dicing the substrate wafer into separated devices, each separated device comprising at least one of the electronic components 10. In the embodiment depicted in FIG. 7, the chip 70 or the separated device, respectively comprises two or more electronic components 10, wherein two of the components 10 can be seen in the sectional representation in FIG. 7. The chip 70 may comprise any number of electronic components 10.

Compared to FIG. 5, the separated device 70 is turned around so that the first main surface of the separated device 70 is positioned at a bottom side of the separated device 70 visible in FIG. 7. The separated device 70 is in an adequate position for flip-chip mounting same to a laminate/package bottom or second substrate 71, respectively. The laminate/package bottom is located below the separated device 70.

The second substrate 71 comprises second contact pads 73 arranged on a first main surface of the second substrate 71 and symmetrically to the first contact pads 12 on the separated device 70. The second substrate 71 optionally comprises a layer of solder resist 72 on the main surface between the second contact pads 73. The optional solder resist pattern 72 may be deposited on the second substrate 71 on a whole area of the second substrate 71 between the second contact pads 73 or may be a structured pattern at least to oppose the open-top frame structure, so that a connection of the chip 70 with the second substrate 71 provides a sealing of the second open top frame structure 13b and the second substrate 71. When connecting the chip 70 with the second substrate 71 the second open-top frame structure 13b and the second substrate 71 form a cavity or recess around the electronic component 10 on the chip 70 covering the component area 15 on the chip 70 and a cavity area 15b on the second substrate 71. The cavity area 15b on the second substrate 71 symmetrically corresponds to the component area 15 on the chip 70.

Figure 8:
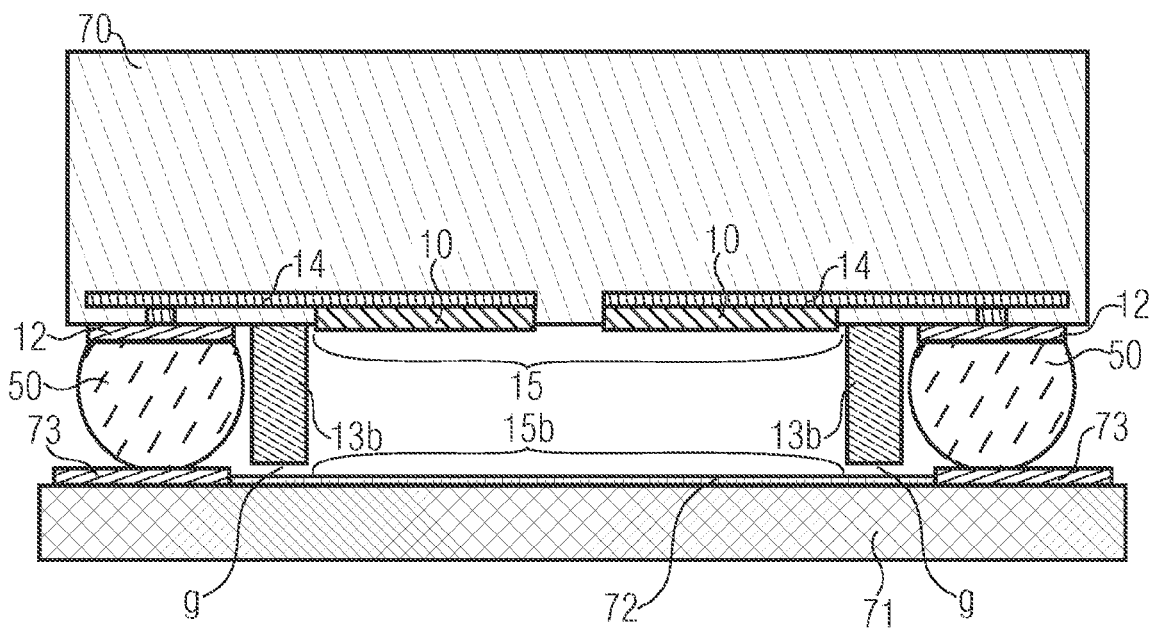
FIG. 8 shows a cross-section of the first substrate, diced into a separate device, as shown in FIG. 7 in contact with the second substrate as shown in FIG. 7.

FIG. 8 shows a cross-section of the first substrate 11 diced into a separate device 70 as shown in FIG. 7 in contact with the second substrate 71 as shown in FIG. 7. The separated device 70 and the second substrate 71 are brought into contact so that the chip 70 contacts the second substrate 71 by the contact balls 50 and the second contact pads 73 of the second substrate 71. The heights of the contact balls 50 and the second open top frame structure 13b are dimensioned in such a way that a gap "g" between the second open top frame structure 13b and the solder resist 72 on the second substrate 71 is formed. The size of the gap "g" is dimensioned such that a following (second) reflowing process for the contact balls 50 may close the gap "g" between the second open top frame structure 13b and the structured solder resist pattern 72 on the second substrate 71. By this (second) reflowing process, a cavity or recess around the electronic component 10 is formed below the component area 15 on the separated device 70 and the cavity area 15b arranged, symmetrically to the component area 15, on the second substrate 71.

Figure 9:
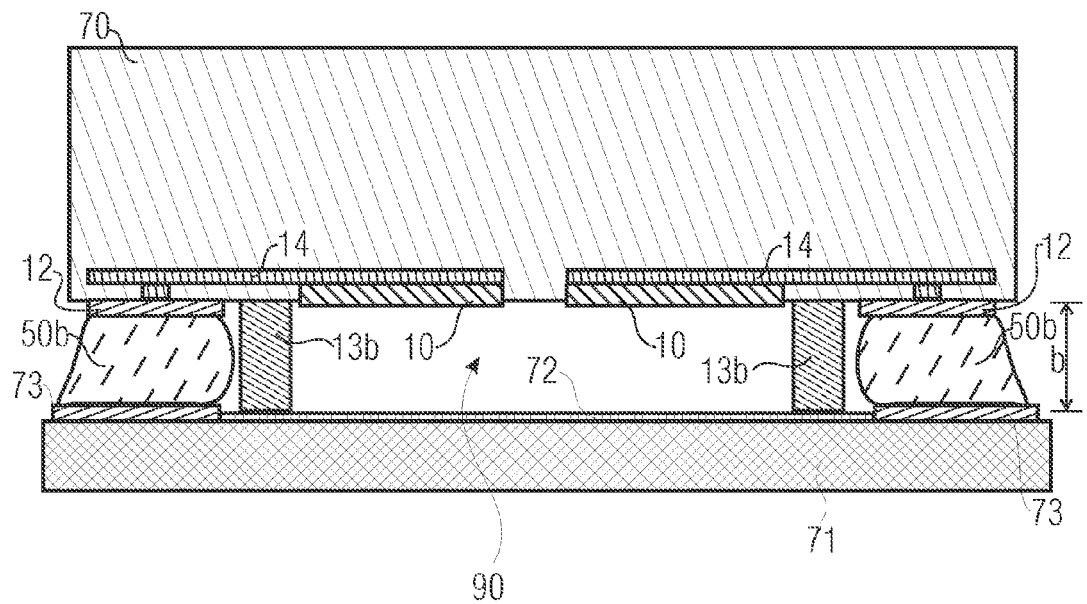
FIG. 9 shows a cross-section of the chip and the second substrate as shown in FIG. 8 after a reflowing process.

FIG. 9 shows a cross-section of the chip 70 and the second substrate 71 as shown in FIG. 8 after a further (second) reflowing process according to an embodiment. A cavity 90 is formed by the second open-top frame structure 13b, the optional structured solder resist pattern 72 on the second substrate 71 and the separated device 70. The first reflowing process forms the solder balls 50 depicted in FIGS. 7 and 8. Then, the (second) further reflowing process for the contact balls 50b forms a connection of the first contact pads 12 with the second contact pads 73 by distributing the solder material of the contact balls 50b over the entire available (wettable) metalized pad surface area of both contact pads 12, 73. By the second reflowing process, the distance between the first contact pads 12 and the second contact pads 73 is reduced in such a way that a gap "g" between the second open-top frame structure 13b and the (structured) solder resist pattern 72 as shown in FIG. 8 is closed. By means of the further (second) reflowing process the solder balls 50 are liquidated and due to capillary forces between the first and the second contact pads 12, 73 and the reflow solder balls 50, the chip 70 is pulled down towards the laminate/package until the second open-top frame structure 13b is seated and protects the resonators or the electronic components 10, respectively from penetration by molding mass. The arrangement and in particular, the amount of the applied solder material, is dimensioned such that the height of the contact balls 50b plus the height of both contact pads 12, 73 correspond to the height of the second open-top frame structure 13b plus the height of the (optional) structured solder resist pattern 72.

The method for housing an electronic component 10 in a device package as described above may further comprise the steps "providing a second substrate 71 having second contact pads 73, wherein the second contact pads 73 are arranged on a first main surface of the second substrate 71 and symmetrically to the first contact pads 12 on the first substrate 11" and "electrically and mechanically connecting the first main surface of the first substrate 11 with the first main surface of the second substrate 71, so that the frame structure 13, 13b and the second substrate 71 form a cavity 90 or recess around the electronic component 10 on the first substrate 11". The first substrate 11 may comprise a plurality of electronic components 10 thereon, the method may further comprise the step "dicing the first substrate 11 into separated devices 70, each separated device 70 comprising at least one of the electronic components 10". The electrically and mechanically connecting may be performed by flip-chip mounting the separated devices 70 onto the second substrate 71, e.g., by reflowing solder material applied to the first contact pads 12 of the first substrate 11 or to the second contact pads 73 of the second substrate 71. The solder may be applied to the contact pads 12, 73 by means of a liquid fill process, template printing or ball placement. The electrically and mechanically connecting the first main surface of the first substrate 11 may also refer to the separated device 70. The electrically and mechanically connecting may be performed before dicing the first substrate 11 into separated devices 70 or after dicing the first substrate 11 into separated devices 70.

Figure 10:
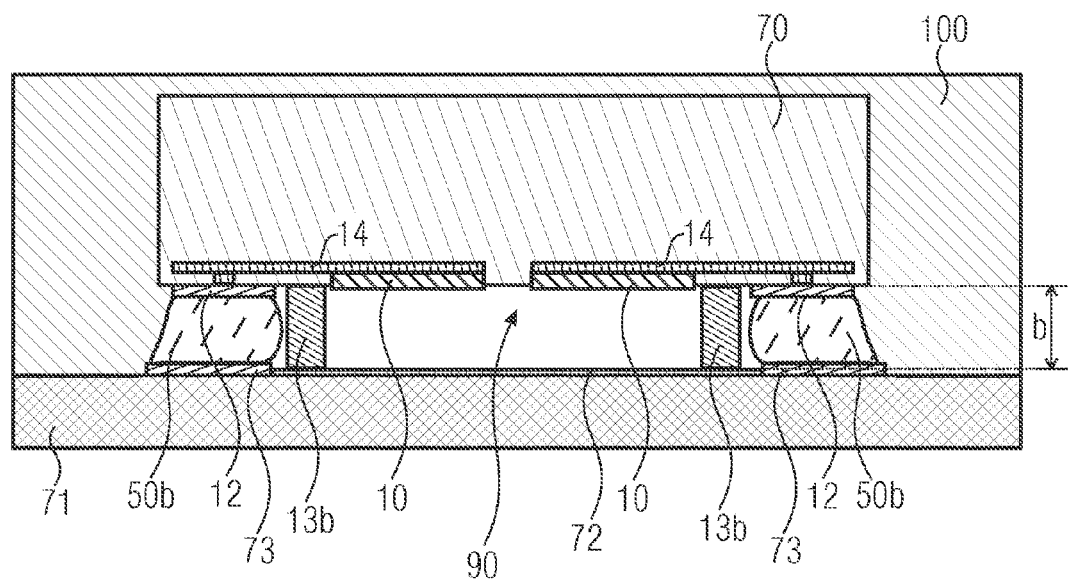
FIG. 10 shows a cross-section of the reflown chip and the second substrate as shown in FIG. 8 molded by a molding mass.

FIG. 10 shows a cross-section of the reflown chip 70 and the second substrate 71 as shown in FIG. 8 surrounded by a molding mass 100 according to an embodiment. The flip-chip mounted chip 70 mounted on the second substrate 71 or laminate/package bottom, respectively is molded by a molding mass 100. The penetration of molding mass 100 is prevented by the second open top frame structure 13b between the chip 70 and the laminate/package bottom 71 forming the cavity 90. The flip-chip mounted chip, mounted on the laminate/package bottom corresponds to the device depicted in FIG. 9.

Figure 9A:
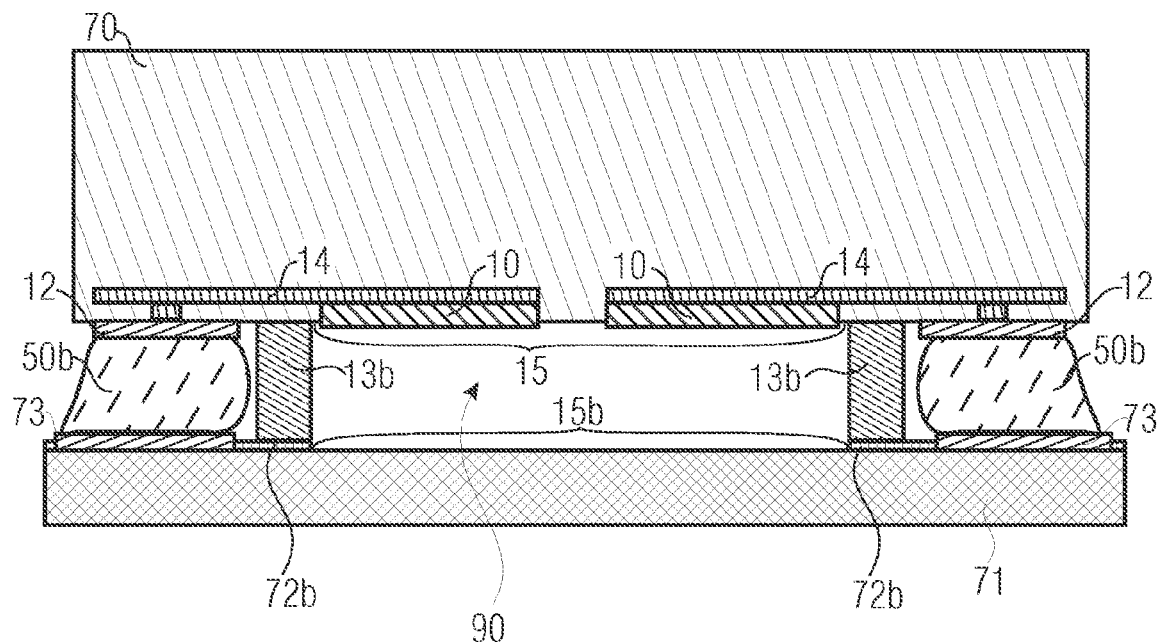
FIG. 9a shows a cross-section of the chip and the second substrate as shown in FIG. 9, wherein the second substrate has no solder resist in the area below the resonators.

FIG. 9a shows a cross-section of the chip 70 and the second substrate 71 as shown in FIG. 9, wherein the second substrate 71 comprises a structured solder resist pattern 72b in the area opposing the second open-top frame structure 13b, wherein the structured solder resist pattern 72b does not cover areas opposing the electronic components 10. The structured solder resist pattern 72b arranged on a contact area between the second open-top frame structure 13b and the second substrate 71 is utilized for sealing the formed cavity 90. The structured solder resist pattern 72b may also be deposited on areas not belonging to the cavity area 15b and the second contact pads 73 area. By means of the further (second) reflowing process the solder balls 50 are liquidated and due to capillary forces between the second contact pads 73 and the reflown solder balls 50, the chip 70 is pulled down towards the laminate/package bottom 71 until the SU-8 frame or the second open-top frame structure 13b, respectively is seated and may protect the resonators 10 from penetration by molding mass 100.

Figure 10A:
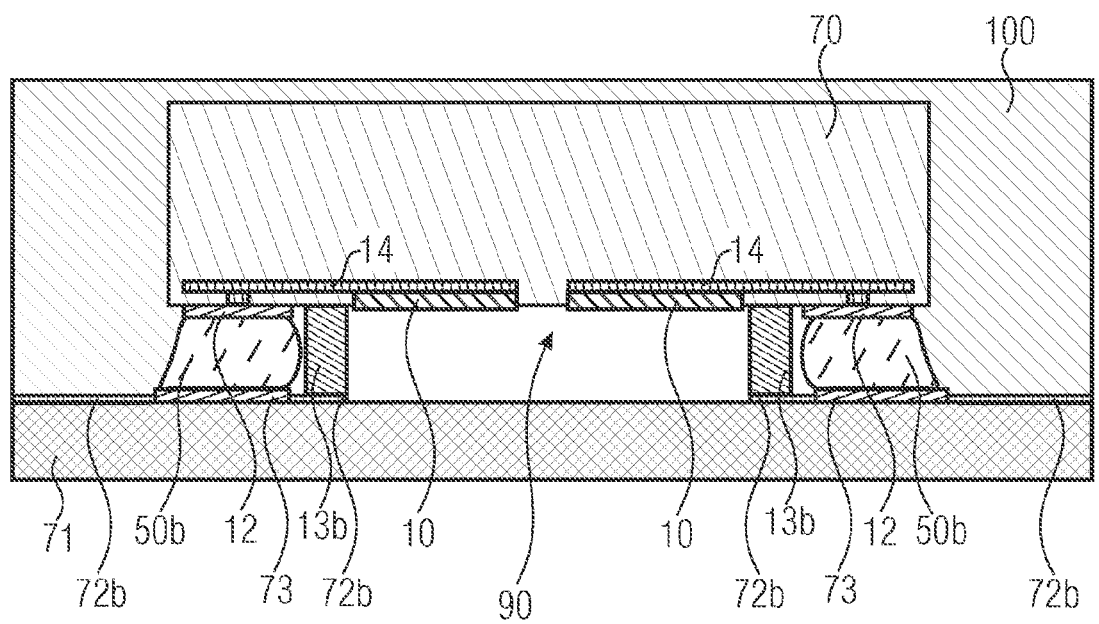
FIG. 10a shows a cross-section of the reflown chip and a second substrate as shown in FIG. 9a molded by a molding mass.

FIG. 10a shows a cross-section of the chip 70 and the second substrate 71 as shown in FIG. 9a after a molding process according to an embodiment. Laminate/package bottom 71 and chip 70 are molded. The penetration of molding mass 100 is prevented by the second open-top frame structure 13b between the chip 70 and the laminate/package bottom 71. The flip-chip mounted chip 70 mounted with the laminate/package bottom 71 corresponds to the representation shown in FIG. 9a. The second substrate 71 comprises a structured solder resist pattern 72b in the area opposing the second open-top frame structure 13b, wherein the structured solder resist pattern 72b does not cover areas opposing the electronic components 10. This may avoid a possible contamination of the electronic components 10 by outgassing effects due to the solder resist material and increases the volume of the cavity 90.

The flip-chip mounting process as depicted in FIGS. 7,8, 9,9a,10,10a is equally applicable to the arrangement of the first open-top frame structure as depicted in FIG. 1 and FIG. 2. The flip-chip mounting process of the chip 70 as depicted in FIG. 7 to 10a is equally applicable to a chip 70 having an open-top frame structure 13 with an inner frame portion as shown in FIGS. 1 and 2. In this case the structured solder resist pattern 72b comprises structures opposing the inner frame portion of the open-top frame structure 13.

The preceding FIGS. 1 to 10a describe a process flow A according to an embodiment. The example in FIG. 1 shows a cross-section through a bulk acoustic wave (BAW) filter provided with a frame, e.g., made of a photo patternable epoxy resist, preferably SU-8. FIG. 2 shows the respective top view. FIGS. 3 and 4 basically show the same frame, except that the interior of the SU-8 frame has no partition walls put up. Having fabricated the SU-8 protective frame, the balls are fabricated. This may be effected by means of template printing or ball placement. After a first reflowing process, the solder balls according to FIGS. 5 and 6 are disposed on the contact pads of the bulk acoustic wave filter devices. Up to this point of the fabrication process, production has been at wafer level. The chips are now diced and subsequently flip-chip mounted. FIGS. 7 and 8 show this process.

As a result of a further (second) reflowing process in the oven, the balls are rendered liquid and the solders spread across the entire available metalized pad surface of the chip and the laminate/package bottom. The solder of the balls spreads across the entire wettable metal surface. By means of the capillary forces acting, the chip is drawn downwards towards the laminate/package bottom. If the solder amount, the pad surfaces of the chip and the pad surfaces of the laminate/package bottom as well as the frame height are balanced relative to one another, the bulk acoustic wave chip is pulled down until the frame made of SU-8 is seated solidly on the laminate/package bottom. In the subsequent molding process, the areas to be protected are not contacted by the molding mass, as depicted in FIGS. 9 and 10. In a further variation, the solder resist may be omitted in the area below the resonators so as to avoid a contamination of the resonators as a result of outgassing, as shown in FIGS. 9a and 10a.

Embodiments fabricate a frame structure on the top side of the chip, which is not provided with a cap. The height and width of the frame may be adjusted such that it sustains the molding pressure and the temperature during the molding process and protects the volume above the areas of the chip to be protected from penetration by the molding mass.

The solder amount applied to the bond pads in the flip-chip mounting and the pad surfaces may be calculated such that the chip with the frame lands flush on the laminate/package bottom during the further reflowing process. Although, due to possible irregularities of the bottom/laminate and frame top edge, minute gaps may remain between the frame and the bottom/laminate, there will be no penetration of molding mass due to the low gap width of less than 1 µm to be expected.

The solution is advantageous in that the total height of the device decreases as a result of omitting the cap layer on the frame, which represents an advantage in competition. Omitting the cap also facilitates the fabrication process. This involves process simplification, throughput time shortening and cost saving.

A further possible approach is the fabrication of a frame for sealing on the laminate/package bottom. Without any additional production steps, it is possible to fabricate a frame that may serve as sealing against the molding mass. This further possible approach is depicted in the following FIGS. 11 to 14.

Embodiments provide a fabrication of a frame structure at the wafer level or at the laminate/package level, which protects the individual device from molding mass penetrating between the chip surface and the laminate/package bottom during molding after a flip-chip mounting.

This frame may be fabricated on the system wafer in a cost effective manner by a photolithographically patternable material, for example, a photo epoxy resist, e.g., SU-8 or on the laminate without any additional layers and patterning steps.

Figure 11:
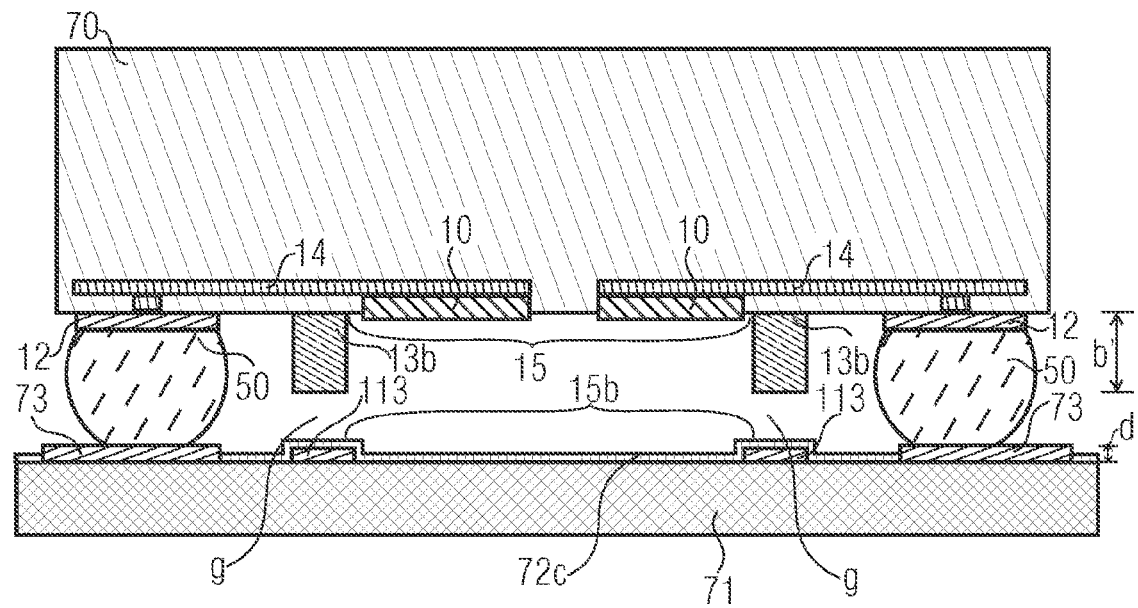
FIG. 11 shows a cross-section of a chip in a flip-chip mounting position comprising the second open top frame structure and contact balls and shows a cross-section of a second substrate with a third open top frame structure in contact with the contact balls.

FIG. 11 shows a cross-section of a chip 70 in a flip-chip mounting position comprising the second open-top frame structure 13b, balls 50 made of solder and shows a cross-section of a second substrate 71 with a third open-top frame structure 113 in contact with the contact balls 50 according to another embodiment. In this embodiment not only the chip 70 but also the second substrate 71 comprises an open-top frame structure. The chip 70 comprises the second open-top frame structure 13b and the second substrate 71 comprises the third open-top frame structure 113. The second open-top frame structure 13b may be made of SU-8 photo patternable epoxy resist while the third open top frame structure 113 on the main surface of the second substrate 71 may be made of metal, for example. By using two open-top frame structures 13b, 113, the height of the second open top frame structure 13b may be reduced.

At the main surface of the second substrate 71, a third structured solder resist pattern 72c is deposited in such a manner that the third structured solder resist pattern 72c covers the main surface of the second substrate 71 at areas not belonging to the areas of the second contact pads 73. This means that the third open-frame structure 113 is covered by solder resist. By applying the third structured solder resist pattern 72c on the third open-top frame structure 113 the height of the second open-top frame structure 13b may be further reduced. The metal ply opposite the SU-8 frame provides the possibility of further reducing the height of the second open-top frame.

Figure 12:
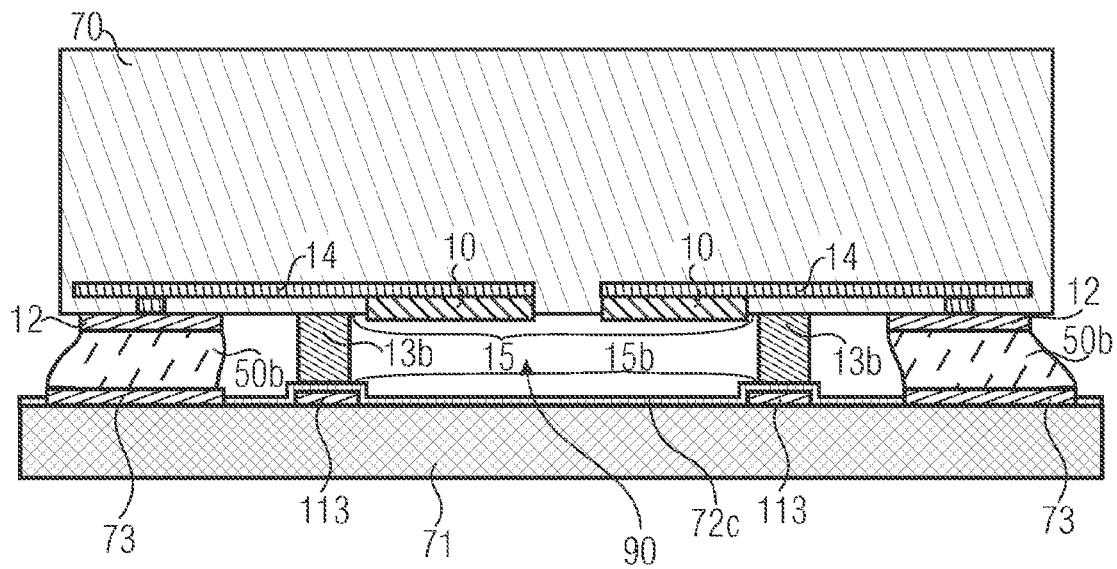
FIG. 12 shows a cross-section of the chip and the second substrate as shown in FIG. 11 after a reflowing process.

The heights of the second open-top frame structure 13b, the third open-top frame structure 113 and the (optional) third structured solder resist pattern 72c are dimensioned such that a subsequent (second) reflowing process will close the gap "g" between both frame structures, which can be seen in FIG. 12. A height "b" of the second open-top frame structure 13b as depicted in FIG. 7-10a may be reduced by a height "d" of the third open-top frame structure 113 resulting in a height "b'". An arrangement comprising open-top frame structures 13b, 113 on the chip 70 and on the second substrate 71 has a total height of "b'+d". This corresponds to an arrangement comprising only one open-top frame structure 13b having the (total) height "b": "b'+d=b".

FIG. 12 shows a cross-section of the chip 70 and the second substrate 71 as shown in FIG. 11 after a second reflowing process. While the first reflowing process is applied for forming solder balls 50, the further (second) reflowing process is applied for forming solder contacts 50b. The solder balls 50 reflow to solder contacts 50b reducing the distance between the chip 70 and the second substrate 71. A gap "g" between the second open-top frame structure 13b and the third structured solder resist pattern 72c on the third open-top frame structure 113 may be closed. By an adequate dimensioning of the solder mass of the contact balls 50, the cavity 90 protecting the electronic components 10 may be closed. By means of the capillary forces during the second reflowing process, the second open-top frame structure 13b is brought into contact with the laminate/package bottom 71.

The method for housing an electronic component 10 in a device package as described above may further comprise the step "before providing the second substrate 71, forming an additional (third) open top frame structure 113 around a cavity area 15b on the first main surface of the second substrate 71, wherein the cavity area 15b symmetrically corresponds to the component area 15 on the first main surface of the first substrate 11 or the chip 70, respectively. The additional open top frame structure 113 or the third open top frame structure 113, respectively may be formed in the same processing step with the second contact pads 73. As the second contact pads 73 and the third open-top frame structure 113 are made of metal, both layers may be produced in the same processing step of a semiconductor production.

Figure 11A:
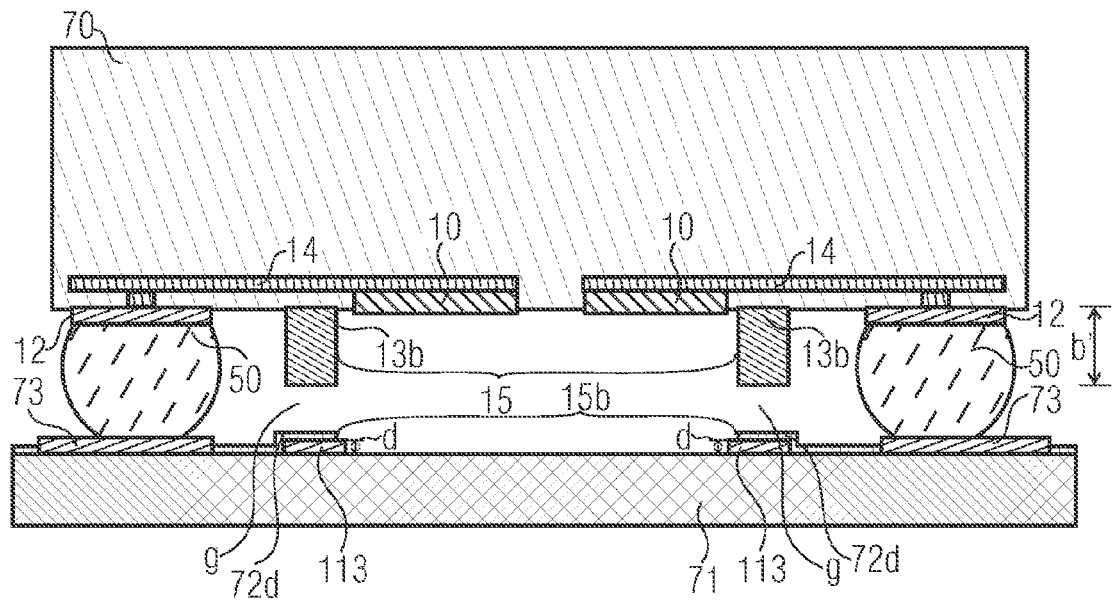
FIG. 11a shows a cross-section of the chip and the second substrate as shown in FIG. 11, wherein the second substrate has no solder resist in the area below the resonators.

FIG. 11a shows a cross-section of the chip 70 and the second substrate 71 as shown in FIG. 11, wherein the second substrate 71 comprises a fourth structured solder resist pattern 72d in the area opposing the second open-top frame structure 13b, wherein the fourth structured solder resist pattern 72d does not cover areas opposing the electronic components 10. By not depositing solder resist material on the cavity area 15b, the volume of the cavity 90, formed between the chip 70 and the second substrate 71 may be increased. The metal ply opposite the SU-8 frame provides the possibility of further reducing the height of the second open-top frame 13b. The fourth structured solder resist pattern 72d is formed on the third open-top frame structure 113 and on areas of the first main surface of the second substrate 71 not belonging to the cavity area 15b and the second contact pads 73 area. Omitted solder resist structures at the cavity area 15b allow a further reduction of the second open-top frame structure 13b, while the volume of the cavity 90 is increased. This may avoid a possible contamination of the electronic components 10 by outgassing effects due to the solder resist material.

Figure 12A:
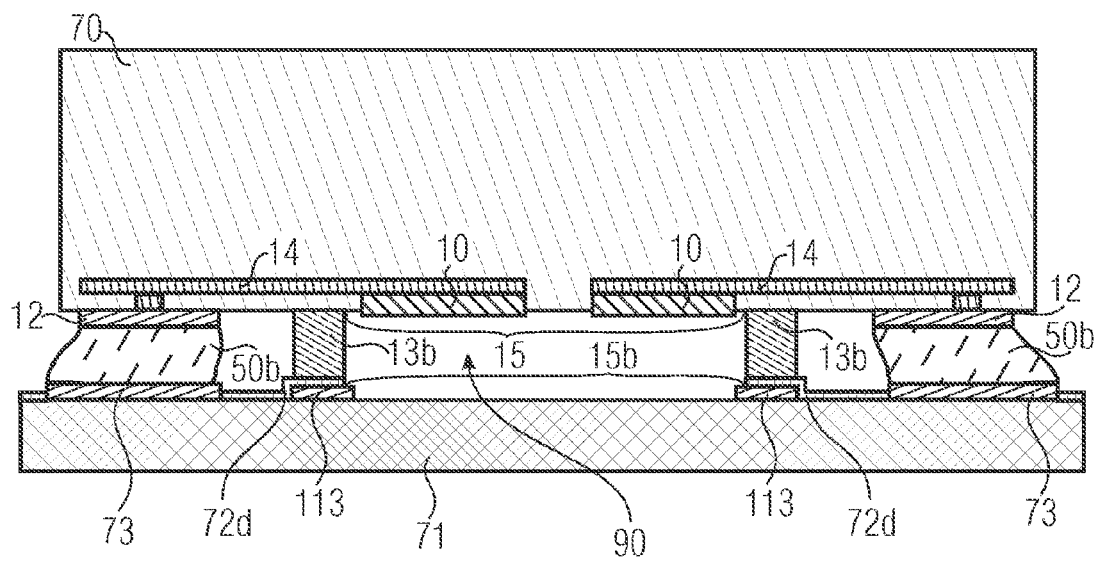
FIG. 12a shows a cross-section of the chip and the second substrate as shown in FIG. 11a after a reflowing process.

The heights of the second open-top frame structure 13b, the third open-top frame structure 113, the (optional) fourth structured solder resist pattern 72d and, in particular, the amount of applied solder material are dimensioned such that a subsequent (second) reflowing process will close the gap "g" between both frame structures, which can be seen in FIG. 12a.

A height "b" of the second open-top frame structure 13b as depicted in FIG. 7-10a may be reduced by a height "d" of the third open-top frame structure 113 resulting in a height "b'". An arrangement comprising open-top frame structures 13b, 113 on the chip 70 and on the second substrate 71 has a total height of "b'+d". This corresponds to an arrangement comprising only one open-top frame structure 13b having the (total) height "b": "b'+d=b".

FIG. 12a shows a cross-section of the chip 70 and the second substrate 71 as shown in FIG. 11a after a (second) reflowing process. By means of the capillary forces the second open-top frame structure 13b is brought in contact with the laminate/package bottom 71. The arrangement depicted in FIG. 12a corresponds to the arrangement depicted in FIG. 12, wherein the third structured solder resist pattern 72c is replaced by a fourth structured solder resist pattern 72d having no structures in the cavity area 15b.

FIGS. 11 to 12a describe a process flow B, wherein the chip 70 and the second substrate 71 both comprise an open top frame structure. If structures, the level of which is above that of the metal pads on the laminate, are constructed opposite the SU-8 frame, the height of the SU-8 frame may be reduced by the amount of the height of the structures on the laminate according to FIGS. 11 and 12. The elevated structure opposite the SU-8 frame may be fabricated by a metal ply made of the metal as that of the laminate pads and an overlying structured solder resist pattern.

As a further variation, the solder resist may be omitted in the area below the resonators as depicted in FIGS. 11a and 12a so as to avoid a contamination of the resonator as a result of outgassings.

The flip-chip mounting process as depicted in FIGS. 11, 12, 11a, 12a is equally applicable to the arrangement of the first open-top frame structure 13 as depicted in FIG. 1 and FIG. 2. The flip-chip mounting process of the chip 70 as depicted in FIG. 11 to 12a is equally applicable to a chip 70 having an open-top frame structure 13 with an inner frame portion as shown in FIGS. 1 and 2. In this case the third open-top frame structure 113 and the structured solder resist pattern 72c, 72d comprise structures opposing the inner frame portion of the open-top frame structure 13.

Figure 13:
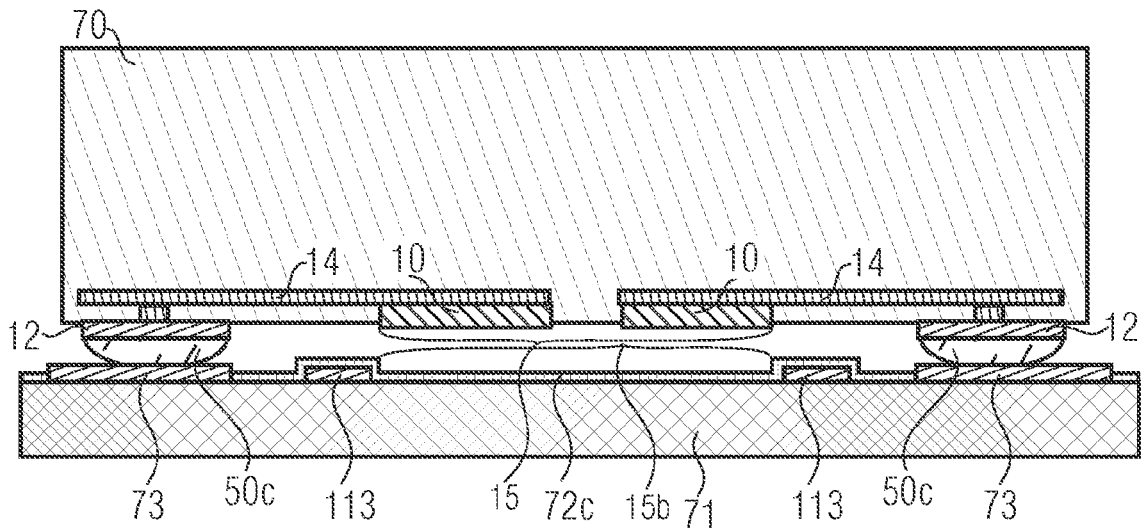
FIG. 13 shows a cross-section of a chip having no frame structure and a second substrate with the third open-top frame structure as shown in FIG. 11.

FIG. 13 shows a cross-section of a chip 70 comprising no open-top frame structure and a second substrate 71 with the third open top frame structure 113 as shown in FIG. 11 according to another embodiment. By reducing the solder amount present in the solder contact balls 50c, a frame made of SU-8 may be completely omitted if the pad surfaces are suitably sized. The sealing is then provided for by the metal frame constructed of metal and the (optional) solder resist pattern 72c. The second substrate 71 corresponds to the second substrate 71 depicted in FIG. 11 comprising the third open top frame structure 113, the third structured solder resist pattern 72c and the second contact pads 73. The chip 70 comprises no frame structure, so that the solder balls 50c may have a reduced amount of solder dimensioned in such a way as to close the cavity between the chip 70 and the second substrate 71 after a reflowing process.

Figure 14:
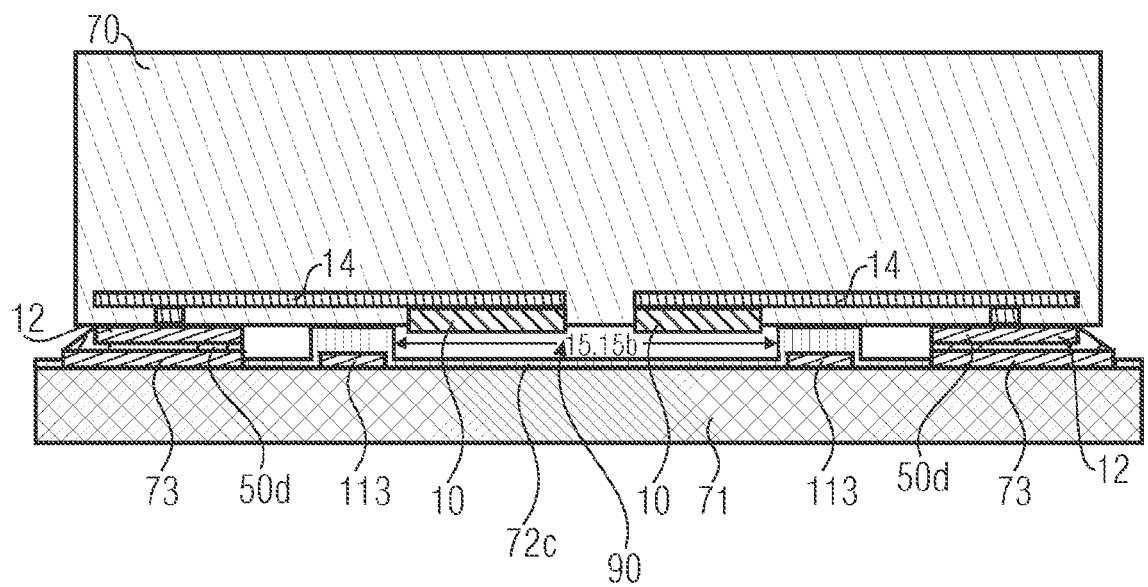
FIG. 14 shows a cross-section of the chip and the second substrate as shown in FIG. 13 after a reflowing process.

FIG. 14 shows a cross-section of the chip 70 and the substrate 71 as shown in FIG. 13 after a second reflowing process. The reduced solder balls 50c corresponding to FIG. 13 are transformed to solder contacts 50d due to the second reflowing process, which solder contacts 50d are dimensioned such that the solder of the balls spreads across the entire wettable metal surface of the contact pads 12 and the second contact pads 73. The solder contacts 50d are adapted to close the cavity 90 formed between the chip 70 and the second substrate 71. The cavity 90 is closed between the main surface of the chip 70 and the third structured solder resist pattern 72c deposited on the third open-top frame structure 113 on the main surface of the second substrate 71. By means of the capillary forces, the solder resist frame or the third structured solder resist pattern 72c respectively on the laminate/package bottom 71 is brought in contact with the chip 70.

FIGS. 13 and 14 describe a process flow C for housing an electronic component 10 in a device package, wherein the laminate/package bottom 71 comprises an open-top frame structure and the chip 70 comprises no such frame structure. If the construction metal and the solder resist are sufficiently high, the production of a frame at wafer level may be completely saved. The sealing is then fully provided by the frame fabricated in the laminate/package bottom 71 as depicted in FIGS. 13 and 14. Here, and also in a further variation, the solder resist may be omitted in the area below the resonators so as to avoid contamination of the resonators as a result of outgassings. This further variation is not shown in FIGS. 13 and 14, however, it corresponds to the construction of the second substrate 71 according to embodiments depicted in FIG. 11a and FIG. 12a.

A method for housing an electronic component 10 in a device package according to the representation shown in FIGS. 13 and 14 may comprise the following steps: providing a first substrate, wherein the electronic component is arranged in a component area on a first main surface of the first substrate, and wherein first contact pads, electrically coupled to the electronic component, are arranged on the first main surface and outside of the component area, providing a second substrate having second contact pads, wherein the second contact pads are arranged on a first main surface of the second substrate, forming an open-top frame structure around a cavity area on the first main surface of the second substrate, the cavity area symmetrically corresponding to the component area on the first main surface of the first substrate and electrically and mechanically connecting the first main surface of the first substrate with the first main surface of the second substrate so that the frame structure and the second substrate form a cavity or recess around the electronic component on the first substrate. The method may further comprise the step before providing the second substrate, forming an additional open-top frame structure around a component area on the first main surface of the first substrate, wherein the component area symmetrically corresponds to the component area on the first main surface of the first substrate. The first substrate may comprise a plurality of electronic components thereon, the method may further comprise a dicing of the first substrate into separated devices, each separated device comprising at least one of the electronic components. The electrically and mechanically connecting may be performed by a flip-chip mounting of the separated devices onto the second substrate and by reflowing solder material applied to the contact pads of the first substrate or to the second contact pads of the second substrate. The solder may be applied to the contact pads by means of a liquid fill process, by a solder print process, by template printing or by ball placement. A solder resist may be applied on at least a portion of the first main surface of the second substrate outside the second contact pads. In a molding process, a mold may be applied on the flip-chip mounted device for closing the cavity or recess in the device package.

Figure 15:
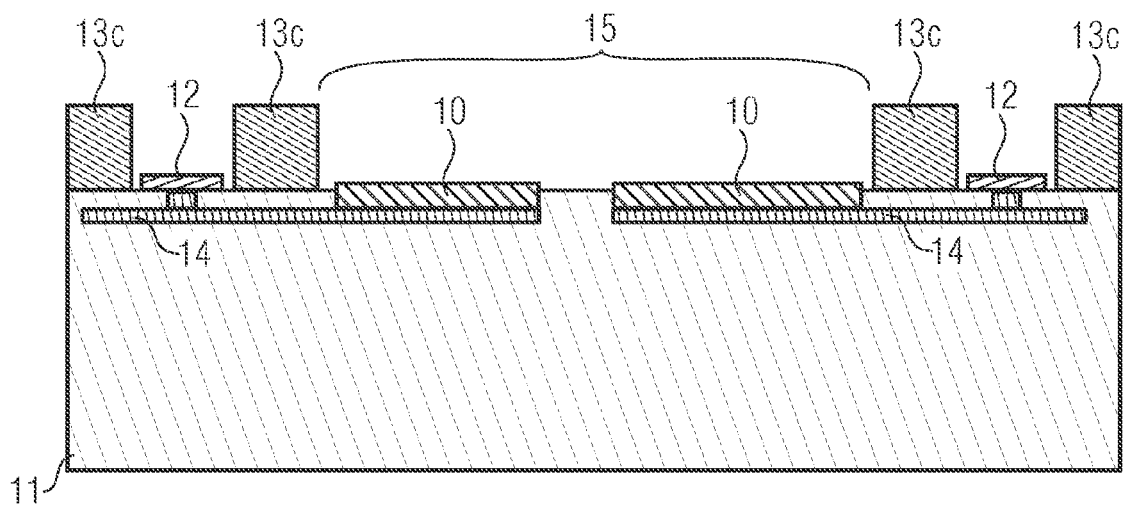
FIG. 15 shows a cross-section G-H of a first substrate with a fourth open-top frame structure.

FIG. 15 shows a cross-section G-H of a first substrate 11 with a fourth open-top frame structure 13c according to another embodiment. The fourth open-top frame structure 13c may comprise an optional inner frame structure which is not shown in FIGS. 15 and 16. The fourth open-top frame structure 13c is adapted to cover the whole surface of the chip 70 and to leave only exposed the area around the resonators 10 and the contact pads 12 as well as optional supply trenches. In contrast to the first open-top frame structure 13 and the second open-top frame structure 13b the fourth open-top frame structure 13c is deposited on the whole first substrate 11 beside the component area 15 and areas of the first contact pads 12.

Figure 16:
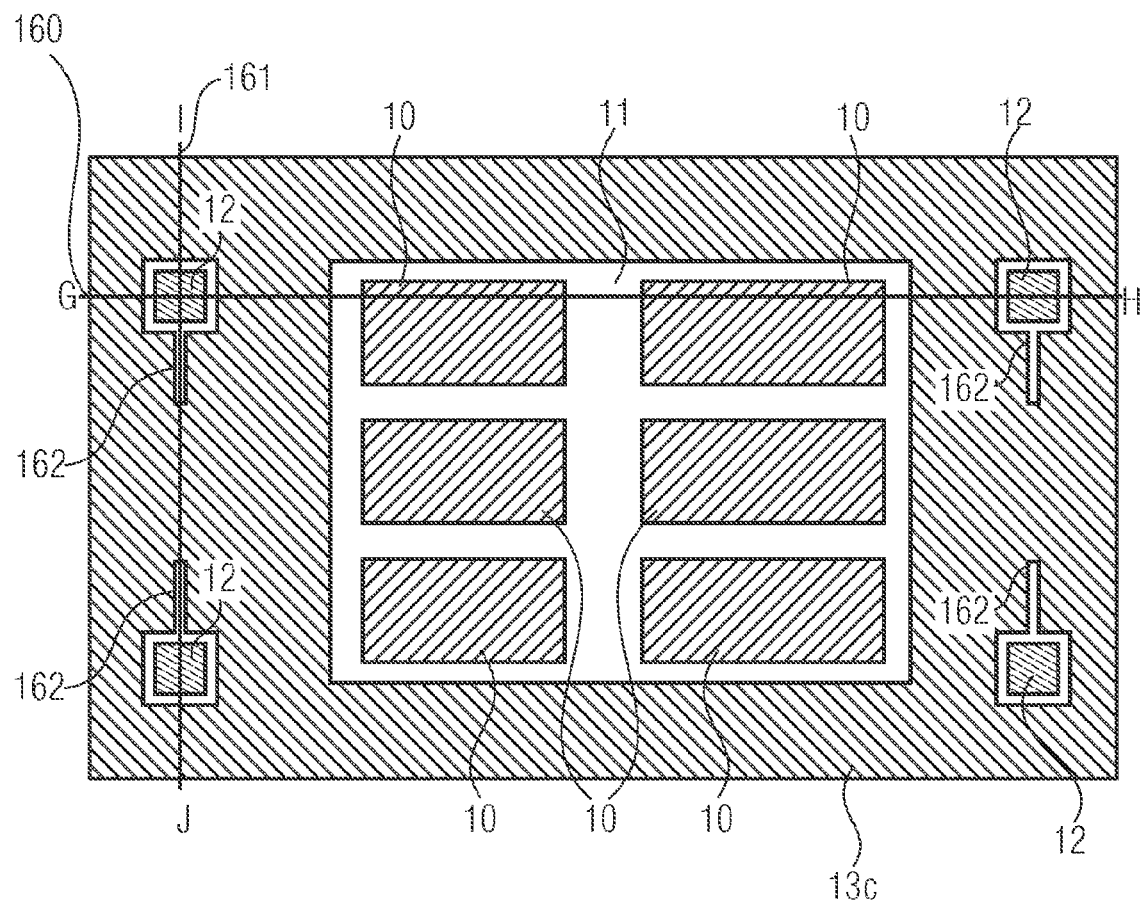
FIG. 16 shows a top view of the first substrate as shown in the cross-section G-H in FIG. 15 comprising solder supply trenches and the two cut axes G-H and I-J.

FIG. 16 shows a top view of the first substrate 11 as shown in the cross-section G-H in FIG. 15 and the cut axes G-H and I-J comprising solder supply trenches 162. The fourth open-top frame structure 13c is adapted to form the solder supply trenches 162, which form an additional opening combined with the opening of the first contact pads 12. The opening of the first contact pads 12 and the solder supply trenches 162 may be filled with solder material.

Figure 17:
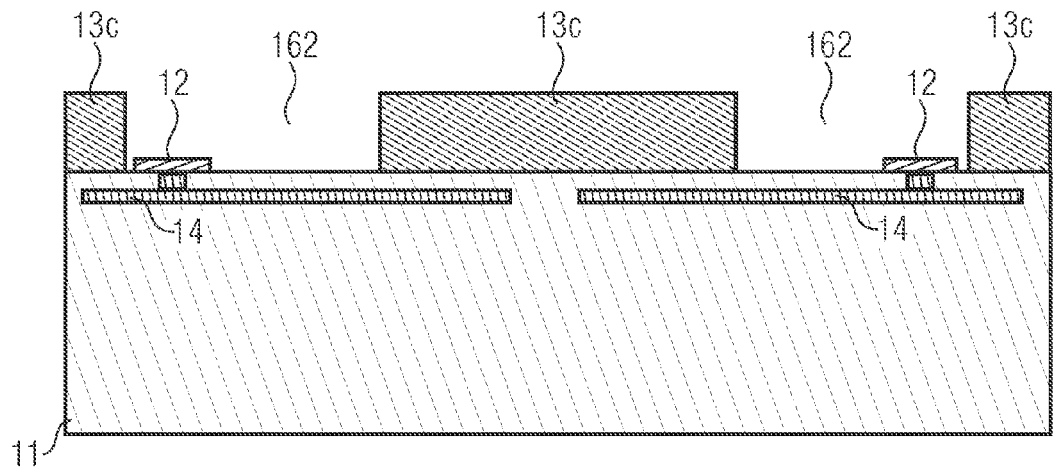
FIG. 17 shows a cross-section I-J of the first substrate as shown in FIG. 16.

FIG. 17 shows a cross-section I-J of the first substrate 11 as shown in FIG. 16. The SU-8 frame structure covers the whole surface of the chip 70 and leaves exposed only the area around the resonators 10 and the contact pads 12 as well as the supply trenches 162. This sectional view cut by the axis I-J allows looking at the solder supply trenches 162 that are arranged beneath the first contact pads 12 forming a composite opening for filling solder supply.

Figure 18:
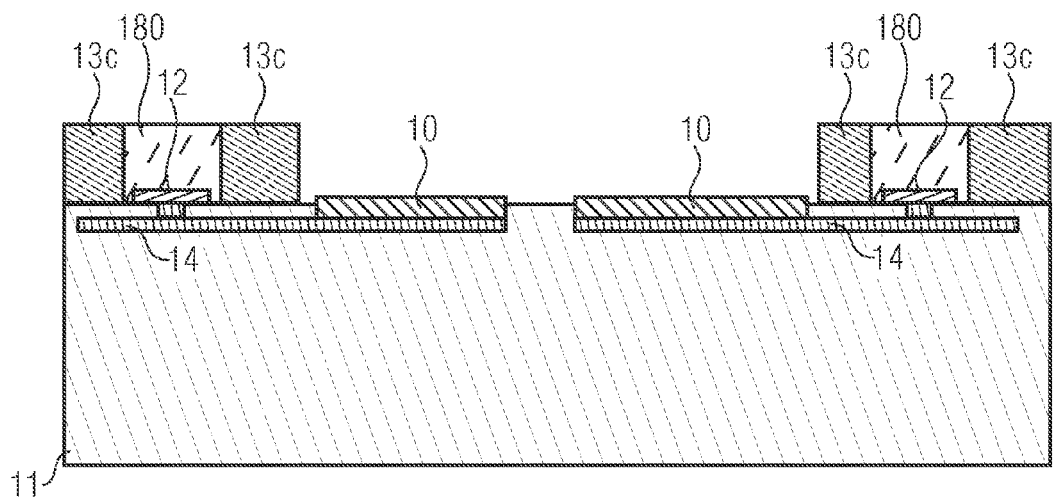
FIG. 18 shows a cross-section K-L of the first substrate as shown in FIG. 15 with the pad area filled with solder.

FIG. 18 shows a cross-section K-L of the first substrate 11 as shown in FIG. 15 with the pad area filled with solder. The pad area corresponds to the opening above the first contact pads 12 formed by the fourth open-top frame structure 13c and the additional opening of the solder supply trenches that are not visible in FIG. 18. The pad area is filled with solder 180, e.g., by means of liquid fill.

Figure 19:
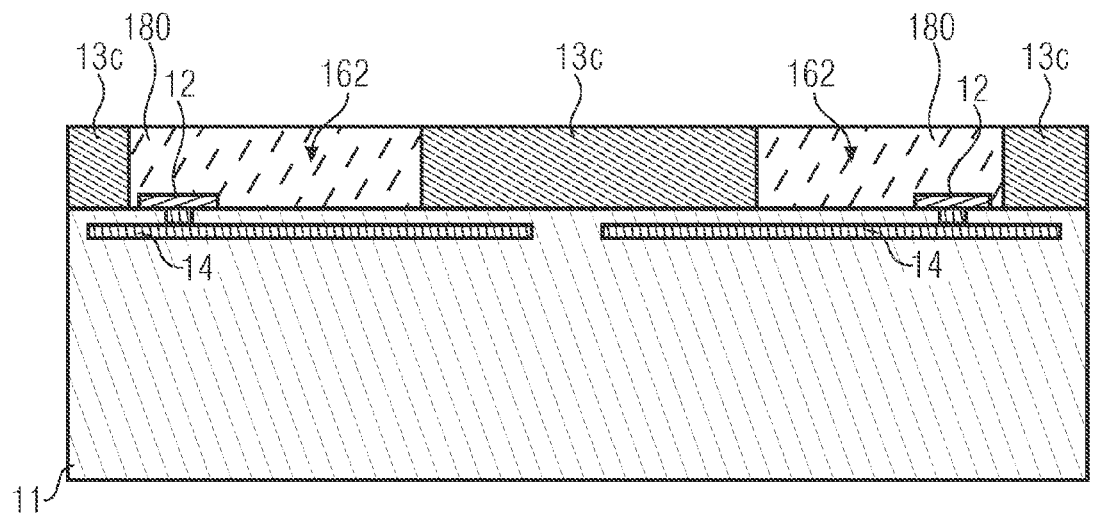
FIG. 19 shows a cross-section M-N of the first substrate as shown in FIG. 17 with the pad area and the solder supply trenches filled with solder.

FIG. 19 shows a cross-section M-N of the first substrate 11 as shown in FIG. 17 with the pad area and the solder supply trenches filled with solder 180. This sectional view depicts the pad area above the first contact pads 12 and areas above the solder supply trenches 162, wherein the fourth open-top frame structure 13c forms openings, which comprise areas above the first contact pads 12 and areas above the solder supply trenches 162. These openings are filled with solder 180.

Figure 20:
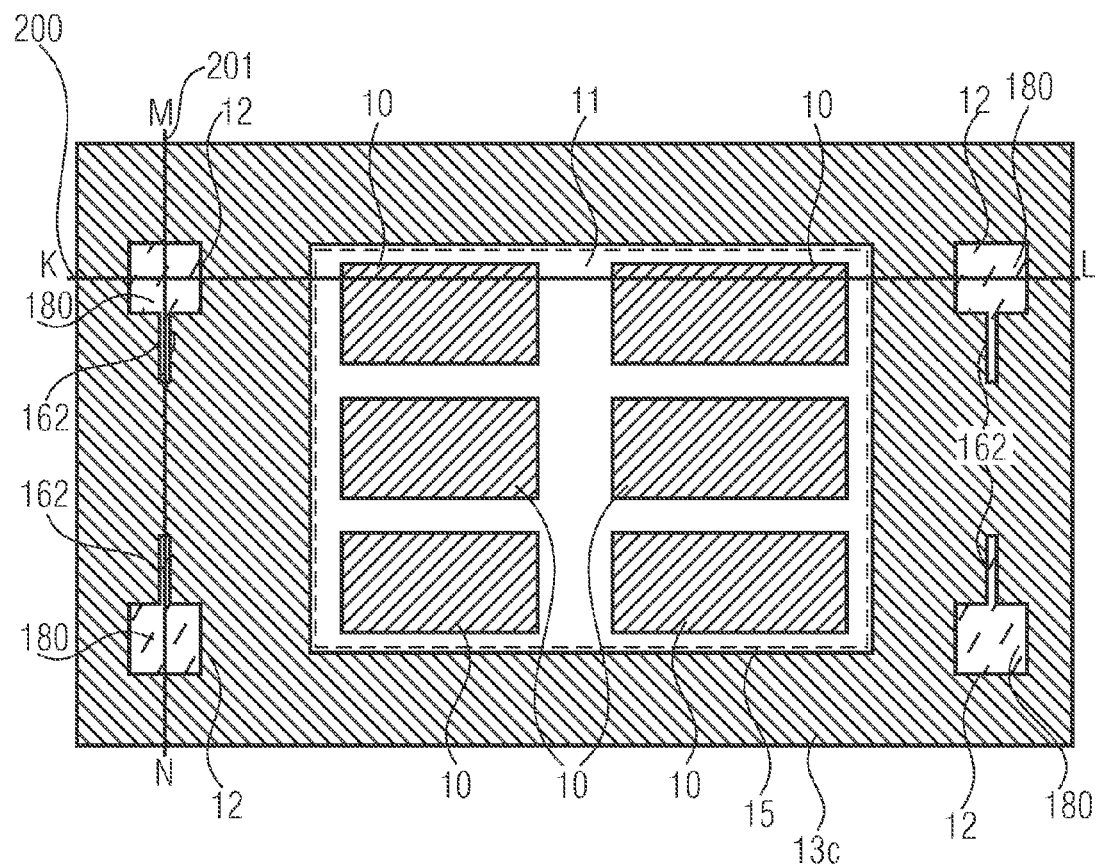
FIG. 20 shows a top view of the first substrate as shown in FIG. 16 with the pad area and the solder supply trenches filled with solder and the two cut axes K-L and M-N.

FIG. 20 shows a top view of the first substrate 70 as shown in FIG. 16 with the pad area and the solder supply trenches filled with solder 180 and the cut axes K-L and M-N. The first substrate 11 comprises a fourth open-top frame structure 13c forming four openings or optional any other number of openings, which comprise the areas of the first contact pads 12 and the areas above the solder supply trenches 162. The fourth open-top frame structure further forms an opening above the component area 15. The first substrate 11 further comprises six resonator stacks 10 arranged on the component area 15. Two cut axes K-L 200 and M-N 201 are also depicted. The first substrate 11 as represented in FIG. 20 corresponds to the representation in FIG. 16, wherein the pad area of the first contact pads 12 and the solder supply trenches 162 are filled with solder 180.

FIGS. 15 to 20 are representations of a process flow D forming openings on the first contact pads 12 and the supply trenches 162. The application of solder onto the contact pads of the system wafer according to FIGS. 15, 16 and 17 may be effected by means of liquid fill process, for example. After the filling process, solder is left behind in the pad area, as here metal lies exposed and the solder wets the pad, thus finding hold. In the area of the resonators, silicon nitride (SiN), may be present as a background, which the solder cannot adhere to, as depicted in FIGS. 18, 19, 20. The electronic components 10 may be made of a material where the solder cannot adhere to, for example made of silicon nitride.

Figure 21:
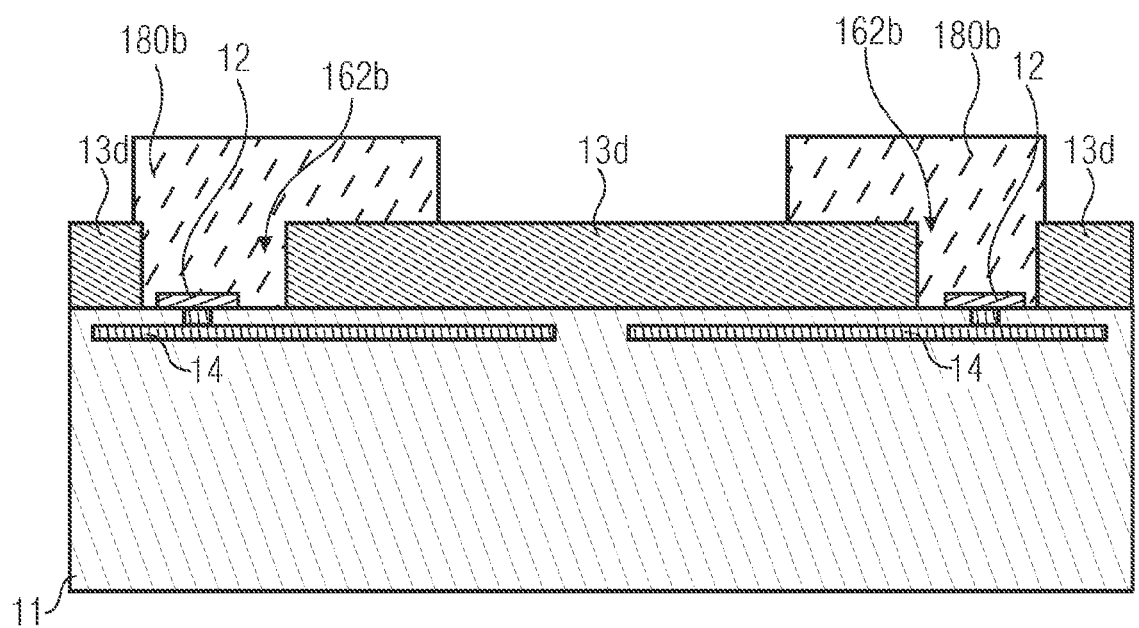
FIG. 21 shows a cross-section O-P of a first substrate with a fifth open-top frame structure comprising solder repositories on the contact pad area and on the solder supply trench area.

FIG. 21 shows a cross-section O-P of a first substrate 11 with a fifth open-top frame structure 13d comprising solder repositories on the contact pad and solder supply trench area according to another embodiment. The fifth open-top frame structure 13d covers the first substrate 11 also on areas separating the individual electronic components 10 from each other. Solder material 180b is filled in the openings above the solder supply trenches 162 and above the first contact pads 12. The solder repository 180b fills the opening to a height above the height of the fifth open-top frame structure 13d made of SU-8. A solder repository 180b is applied on the first contact pads 12, in the solder supply trenches 162 and on the fifth open-top frame structure 13d in the direct environment of the opening. The solder repository 180b may also be applied on a first substrate 11 which comprises no dedicated solder supply trenches 162, for example, by applying on the first contact pads 12 and on the fifth open-top frame structure 13d. The application of the solder repository 180b is not necessary limited to the direct environment of the opening. It may, for example, be applied on portions of the fifth open-top frame structure 13d. It may extend, for example, from one of the first contact pads 12 to a second of the first contact pads 12. Solder supply trenches 162 are optional. Also the form of the solder supply trenches 162 is not limited to the form as represented in FIG. 21. The solder supply trenches 162 may be formed asymmetrically, each solder supply trench may differ in its form. The solder repository 180b may also be asymmetrically applied on said pads and structures. The solder repository 180b may be printed on said pads and structures by a solder print process.

Figure 22:
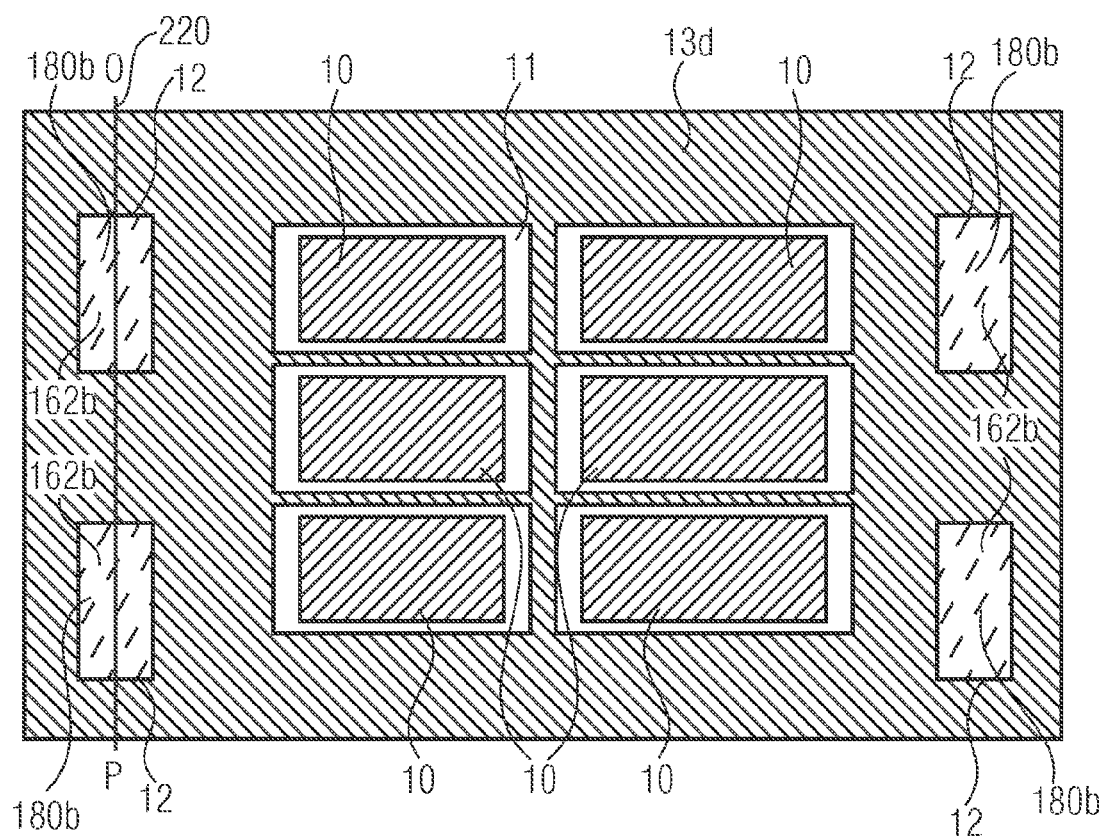
FIG. 22 shows a top view of the first substrate as shown in FIG. 21 and the cut axis O-P.

FIG. 22 shows a top view of the first substrate 11 as shown in FIG. 21 and the cut axis O-P. The fifth open top frame structure 13d comprises an optional inner frame portion separating the electronic components 10 from each other and an outer frame covering the first substrate 11 on portions of the main surface of the first substrate 11 not belonging to the first contact pads 12 and the solder supply trenches 162.

Figure 23:
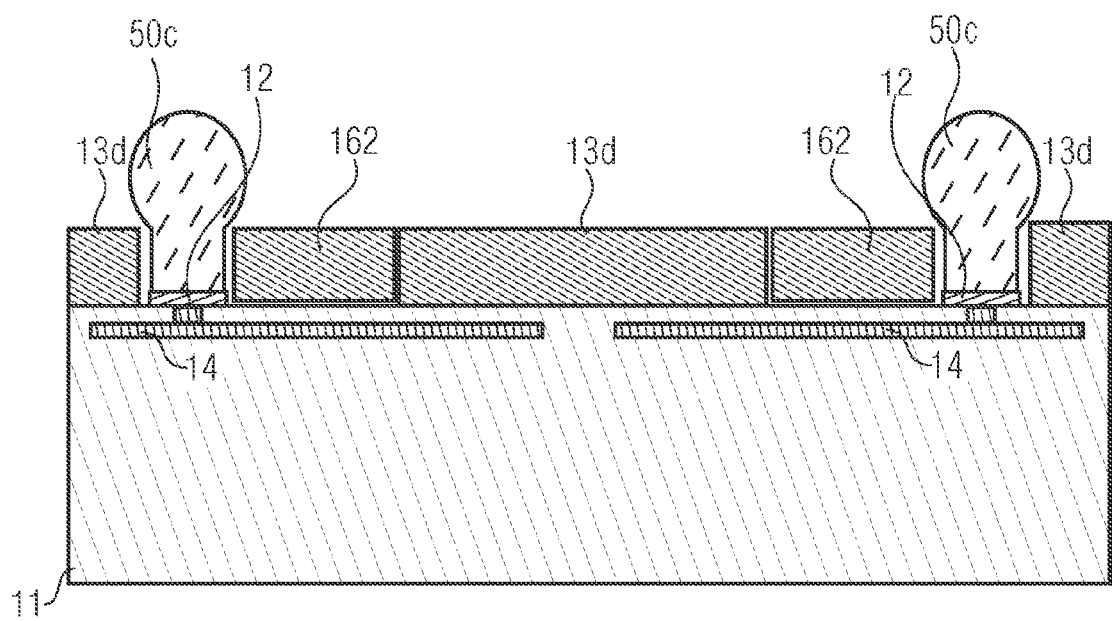
FIG. 23 shows a cross-section Q-R of the first substrate as shown in FIG. 21 after a reflowing process.

FIG. 23 shows a cross-section Q-R of the first substrate 11 as shown in FIG. 21 after a (first) reflowing process of the solder balls 50c. Above the contact pad areas of the first contact pads 12 solder balls 50c are fabricated by means of (first) reflowing in the oven. Compared to the solder balls 50 depicted in the previous Figures, the solder balls 50c have a different form. They are formed of a base structure and a ball structure, wherein the base structure is adapted to connect the ball structure with the contact pad 12 and the ball structure is adapted to connect the first substrate 11 with a second substrate. The base structure is adapted to fill the opening above the first contact pad 12 with material, while the ball structure is adapted to connect the second substrate to the first substrate 11 by a further (second) reflowing process.

Figure 24:
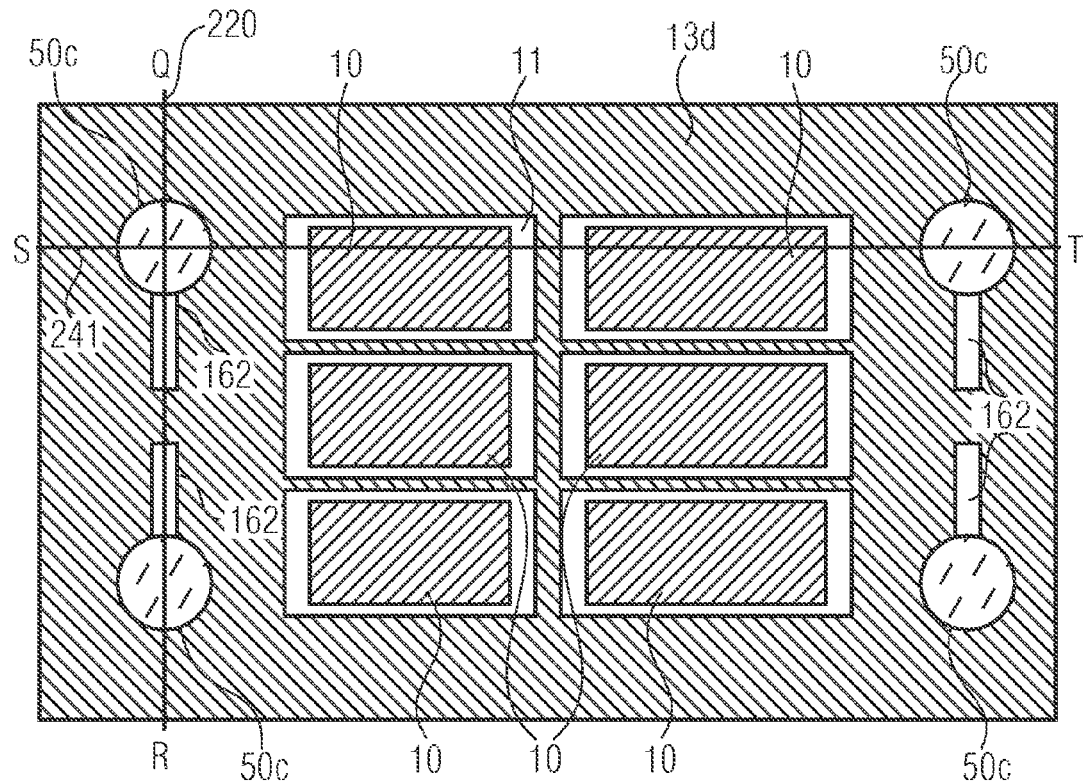
FIG. 24 shows a top view of the first substrate as shown in FIG. 23 and the two cut axes Q-R and S-T.

FIG. 24 shows a top view of the first substrate 11 as shown in FIG. 23 and the cut axes Q-R and S-T. A cut by the cut axis Q-R 240 is depicted in FIG. 23 and a cut by the cut axis S-T 241 is depicted in the following FIG. 25. The representation depicted in FIG. 24 corresponds to the representation depicted in FIG. 22, wherein the solder supply trenches 162 and the areas above the first contact pads 12 are filled with solder, wherein the solder is reflown in an oven to generate the solder balls 50c.

Figure 25:
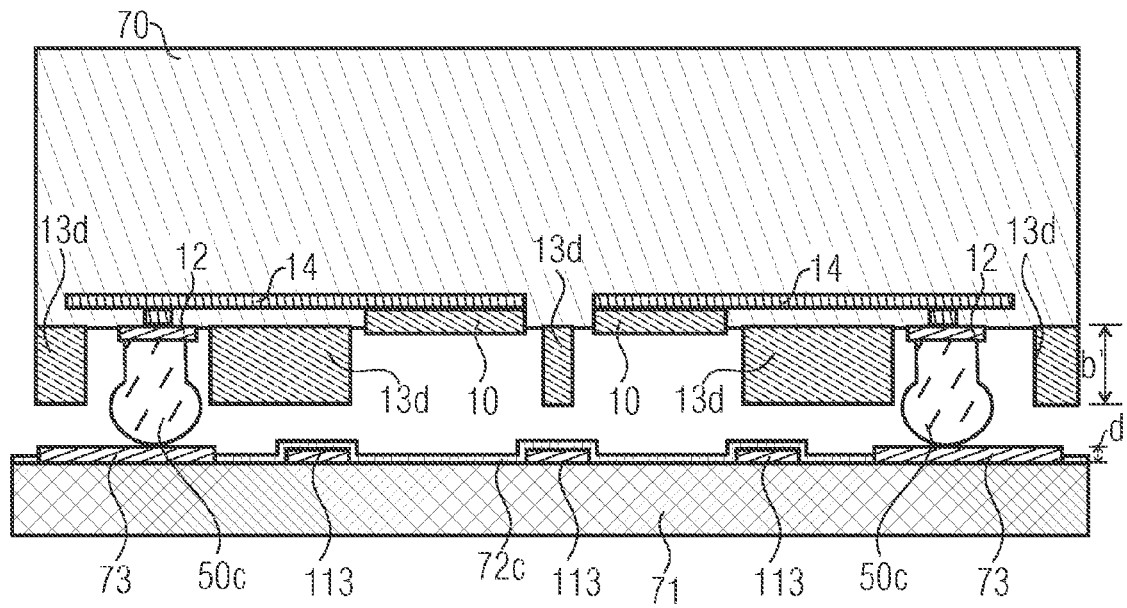
FIG. 25 shows a cross-section S-T of the first substrate as shown in FIG. 24 diced into separate devices and turned in a position for flip-chip mounting and shows a cross-section of a second substrate with the third open-top frame structure as shown in FIG. 11 below the first substrate.

FIG. 25 shows a cross-section S-T of the first substrate 11 as shown in FIG. 24, diced into separate devices 70 and turned in a position for flip-chip mounting and shows a cross-section of a second substrate 71 with the third open-top frame structure 113 as shown in FIG. 11 below the separated device 70. By means of the capillary forces between the second contact pads 73 and the solder balls 50c during a further (second) reflowing process, the chip 70 is pulled down towards the laminate/package bottom 71 until the SU-8 frame or the fifth open-top frame structure 13d, respectively is seated on the laminate frame. The third open top frame structure 113 is made of construction metal and solder resist. The formed cavity protects the resonators 10 from penetration by molding mass.

Figure 26:
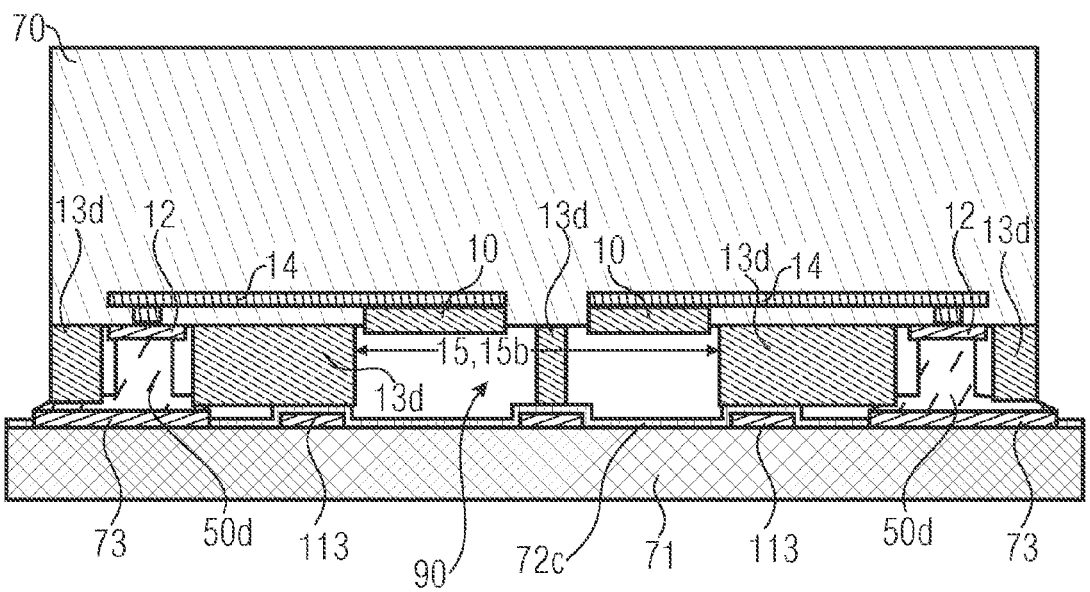
FIG. 26 shows a cross-section of the chip and the second substrate as shown in FIG. 25 after connection of both components by a soldering process and before molding both components.

The heights of the fifth open-top frame structure 13d, the third open-top frame structure 113, the (optional) third structured solder resist pattern 72c and, in particular, the amount of applied solder material are dimensioned such that a subsequent (second) reflowing process will close the gap "g" between both frame structures, which can be seen in FIG. 26.

A height "b" of the fifth open-top frame structure 13d may be reduced by a height "d" of the third open-top frame structure 113 resulting in a height "b'". An arrangement comprising open-top frame structures 13d, 113 on the chip 70 and on the second substrate 71 has a total height of "b'+d". This corresponds to an arrangement comprising only one open-top frame structure 13d having the (total) height "b": "b'+d=b".

The fifth open-top frame structure 13d and the third open-top frame structure 113 may also be differently formed, for example, the fifth open-top frame structure 13d may have a higher inner frame portion than outer frame portions and the third open-top frame structure 113 may have a smaller inner frame portion than outer frame portions. Both open-top frame structures are adapted to close the cavities 90 when being connected.

FIG. 26 shows a cross-section of the chip 70 and the second substrate 71 as shown in FIG. 25 after connection of both components by a (second) reflowing process and before molding both components. By the second reflowing process the solder balls 50c are transformed to solder contacts 50d spreading across the entire available (wettable) surface of the second contact pads 73 and connecting the chip 70 with the second substrate 71. A cavity 90 is formed by the fifth open-top frame structure 13d on the main surface of the chip 70 and the third open-top frame structure 113 on the first main surface of the second substrate 71. Other embodiments use a fourth open-top frame structure 13c having no frame structure between the resonators 10. The third open-top frame structure 113 may also comprise inner frame structures for separating the resonators 10 from each other, such that by using the fifth open-top frame structure 13d separate cavities 90 are formed around the component area 15. The cavity 90 protects the device against penetration of molding mass.

Embodiments as described in FIGS. 21 to 26 represent a process flow E using solder repositories 180b for connecting the chip 70 to the second substrate 71. Another way of fabricating solder balls is the application of a solder repository on the pads, in the supply trenches and/or on the SU-8 frame in the direct environment as depicted in FIGS. 21 and 22. The solder repository 180b may also be applied on a first substrate 11 which comprises no dedicated solder supply trenches 162, for example, by applying on the first contact pads 12 and on the open-top frame structure 13c. The application of the solder repository 180b is not necessary limited to the direct environment of the opening. It may, for example, be applied on portions of the open-top frame structure 13c. It may extend, for example, from one of the first contact pads 12 to a second of the first contact pads 12. Solder supply trenches 162 are optional. After the (first) reflowing the solder balls with their connections to the pad metal are fabricated according to FIGS. 23 and 24. In the subsequent soldering or second reflowing process, respectively, the chip is then connected to the laminate. Here, the chip is pulled towards the laminate/package bottom, thereby creating a sealing of the volume above the resonators. In a further variation, the solder resist may be omitted in the area below the resonators so as to avoid contamination of the resonators as a result of outgassings. For all variations, the chips thus constructed are then molded as represented in FIGS. 10 and 10a.

Figure 27:
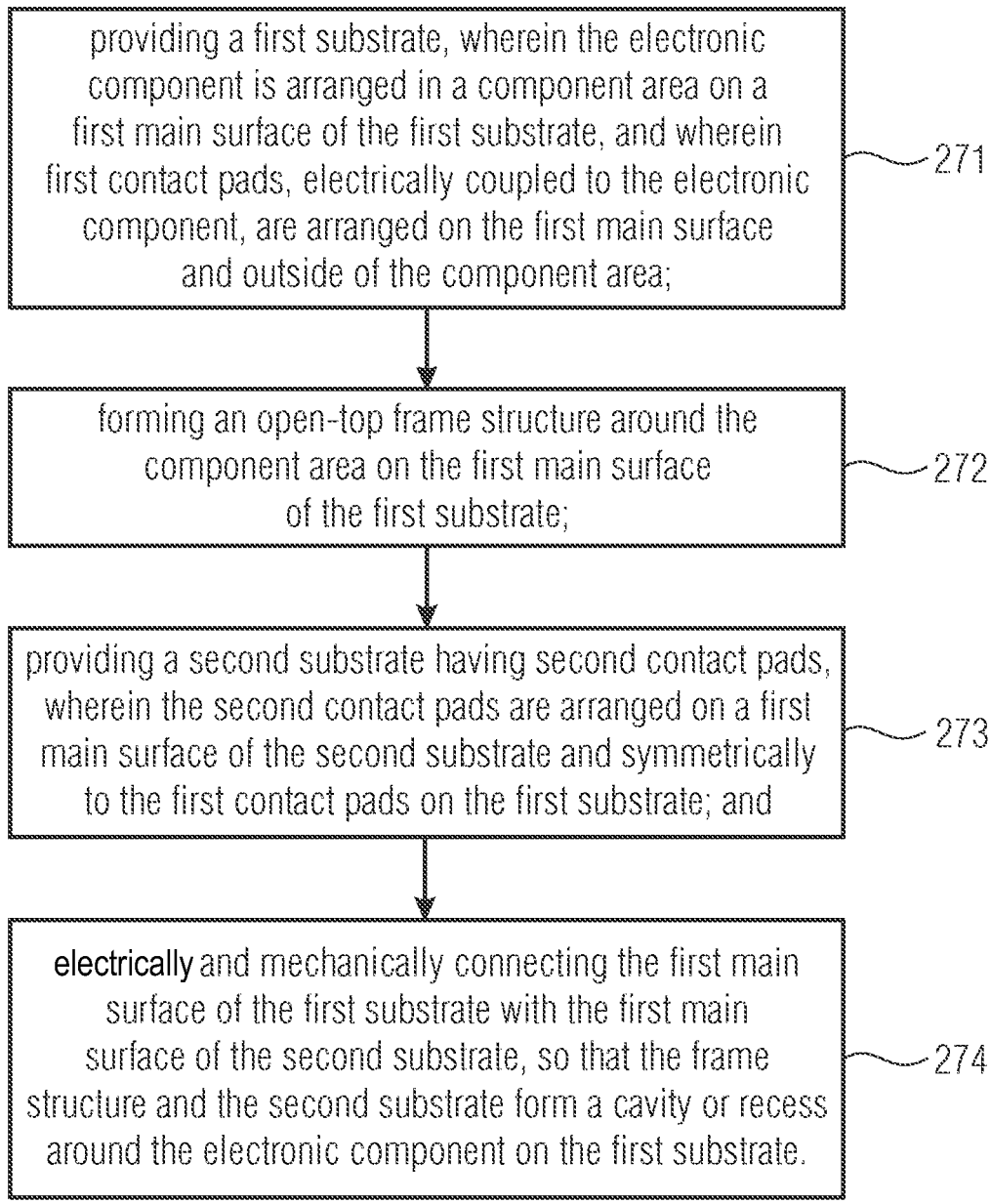
FIG. 27 shows a flow-chart of a method for housing an electronic component in a device package.

FIG. 27 shows a flow-chart of a method 270 for housing an electronic component 10 in a device package comprising the steps providing a first substrate, wherein the electronic component is arranged in a component area on a first main surface of the first substrate, and wherein first contact pads, electrically coupled to the electronic component, are arranged on the first main surface and outside of the component area 271, forming an open-top frame structure around the component area on the first main surface of the first substrate 272, providing a second substrate having second contact pads, wherein the second contact pads are arranged on a first main surface of the second substrate and symmetrically to the first contact pads on the first substrate 273 and electrically and mechanically connecting the first main surface of the first substrate with the first main surface of the second substrate, so that the frame structure and the second substrate form a cavity or recess around the electronic component on the first substrate 274.

Further embodiments provide an electronic component housed in a device package, comprising a first substrate, wherein the electronic component is arranged in a component area on a first main surface of the first substrate, and wherein first contact pads electronically coupled to the electronic component, are arranged on the first main surface and outside of the component area. The electronic component further comprises a second substrate having second contact pads, wherein the second contact pads are arranged on a first main surface of the second substrate and symmetrically to the first contact pads on the substrate. The electronic component comprises an open-top frame structure formed around the component area on the first main surface of the first substrate or around a cavity area on the first main surface of the second substrate, the cavity area symmetrically corresponding to the component area on the first main surface of the first substrate, and wherein the first main surface of the first substrate is electrically and mechanically connected with the first main surface of the second substrate, so that the frame structure and the second substrate from a cavity or recess around the electronic component on the first substrate.

The first substrate may be electrically and mechanically connected to the second substrate by means of a flip-chip mounting and by means of a reflowed solder material applied to the first contact pads of the first substrate or to the second contact pads of the second substrate. The electronic component may be a bulk acoustic wave element, a surface acoustic wave element or an electromechanical structure and may comprise a mold applied to the first substrate mounted to the second substrate for closing the cavity or recess in the device package.

What is claimed is:

1. A method for housing an electronic component in a device package, the method comprising:
providing a first substrate, wherein the electronic component is arranged in a component area on a first main surface of the first substrate, and wherein first contact pads, electrically coupled to the electronic component, are arranged on the first main surface and outside of the component area;
forming an open-top frame structure around the component area on the first main surface of the first substrate;
providing a second substrate having second contact pads, wherein the second contact pads are arranged on a first main surface of the second substrate and symmetrically to the first contact pads on the first substrate; and
electrically and mechanically connecting the first contact pads on the first main surface of the first substrate with the second contact pads on the first main surface of the second substrate by using a solder material, so that the frame structure and the second substrate form a cavity or recess around the electronic component on the first substrate.

2. The method as claimed in claim 1, wherein the first substrate comprises a plurality of electronic components thereon, the method further comprising:
dicing the first substrate into separated devices, each separated device comprising at least one of the electronic components.

3. The method as claimed in claim 2, wherein electrically and mechanically connecting comprises flip-chip mounting the separated devices to the second substrate and reflowing solder material applied to the first contact pads of the first substrate or to the second contact pads of the second substrate.

4. The method as claimed in claim 3, wherein the solder is applied to the contact pads by a liquid fill process, a solder print process, template printing or ball placement.

5. The method as claimed in claim 1, further comprising:
applying a solder resist on at least a portion of the first main surface of the second substrate outside of the second contact pads.

6. The method as claimed in claim 1, wherein the first substrate comprises solder supply trenches made of a material holding the solder and connected with the contact pads on the first main surface and outside of the component area.

7. The method as claimed in claim 6, wherein solder balls are fabricated by application of a solder repository on the contact pads and in addition in the solder supply trenches or on the open-top frame structure.

8. The method as claimed in claim 1, further comprising:
before providing the second substrate, forming an additional open-top frame structure around a cavity area on the first main surface of the second substrate, wherein the cavity area symmetrically corresponds to the component area on the first main surface of the first substrate.

9. The method as claimed in claim 8, wherein the additional open-top frame structure is formed simultaneously with the second contact pads.

10. The method as claimed in claim 1, wherein the electronic component is a bulk acoustic wave element, a surface acoustic wave element or a electromechanical structure.

11. The method as claimed in claim 1, further comprising:
applying a solder resist on at least a portion of the first main surface of the second substrate outside of the second contact pads.

12. The method as claimed in claim 11, wherein the solder resist contacts the frame structure so that the frame structure and the second substrate form a cavity or recess around the electronic component on the first substrate after the first contact pads on the first main surface of the first substrate are electrically and mechanically connected with the second contact pads on the first main surface of the second substrate.

13. A method for housing an electronic component in a device package, the method comprising:
providing a first substrate, wherein the electronic component is arranged in a component area on a first main surface of the first substrate, and wherein first contact pads, electrically coupled to the electronic component, are arranged on the first main surface and outside of the component area;
forming an open-top frame structure around the component area on the first main surface of the first substrate;
providing a second substrate having second contact pads, wherein the second contact pads are arranged on a first main surface of the second substrate and symmetrically to the first contact pads on the first substrate;
applying a solder resist on at least a portion of the first main surface of the second substrate outside of the second contact pads; and
electrically and mechanically connecting the first contact pads on the first main surface of the first substrate with the second contact pads on the first main surface of the second substrate, and attaching the solder resist with the frame structure so that the frame structure and the second substrate form a cavity or recess around the electronic component on the first substrate.

14. The method as claimed in claim 13, wherein the electronic component is a bulk acoustic wave element, a surface acoustic wave element or a electromechanical structure.

15. The method as claimed in claim 13, wherein the first substrate comprises a plurality of electronic components thereon, the method further comprising:
dicing the first substrate into separated devices, each separated device comprising at least one of the electronic components.

16. The method as claimed in claim 15, wherein electrically and mechanically connecting comprises flip-chip mounting the separated devices to the second substrate and reflowing solder material applied to the first contact pads of the first substrate or to the second contact pads of the second substrate.

17. The method as claimed in claim 16, wherein the solder is applied to the contact pads using a liquid fill process, a solder print process, template printing or ball placement.

* * * * *